(12) United States Patent
An et al.

(10) Patent No.: US 12,477,929 B2
(45) Date of Patent: Nov. 18, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Jaesul An, Yongin-si (KR); Sangwon Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 425 days.

(21) Appl. No.: 18/125,001

(22) Filed: Mar. 22, 2023

(65) Prior Publication Data
US 2023/0389394 A1 Nov. 30, 2023

(30) Foreign Application Priority Data
May 26, 2022 (KR) .................. 10-2022-0064778

(51) Int. Cl.
| | | |
|---|---|---|
| H10K 59/80 | (2023.01) | |
| H10K 59/12 | (2023.01) | |
| H10K 71/00 | (2023.01) | |
| H10K 77/10 | (2023.01) | |
| H10K 102/00 | (2023.01) | |

(52) U.S. Cl.
CPC ......... *H10K 59/87* (2023.02); *H10K 59/1201* (2023.02); *H10K 71/00* (2023.02); *H10K 77/111* (2023.02); *H10K 2102/311* (2023.02)

(58) Field of Classification Search
CPC .... H10K 59/87; H10K 59/1201; H10K 71/00; H10K 77/111; H10K 2102/311; H10K 77/10; H10K 50/84; H10K 59/124
See application file for complete search history.

(56) References Cited

U.S. PATENT DOCUMENTS

| | | | |
|---|---|---|---|
| 10,939,547 B2 | 3/2021 | Lee et al. | |
| 11,023,010 B2* | 6/2021 | Park | G06F 3/0412 |
| 11,094,895 B2 | 8/2021 | Dai | |
| 11,289,686 B2 | 3/2022 | Jung et al. | |
| 11,950,453 B2* | 4/2024 | Lee | H10K 59/1201 |
| 2017/0301742 A1 | 10/2017 | Jeong et al. | |
| 2019/0179182 A1* | 6/2019 | Zuo | G06F 3/041 |
| 2022/0102462 A1 | 3/2022 | Zhou et al. | |

FOREIGN PATENT DOCUMENTS

| | | |
|---|---|---|
| CN | 100446157 A | 5/2006 |
| CN | 112133733 A | 12/2020 |
| CN | 108766977 | 4/2021 |
| KR | 1020190102123 A | 9/2019 |
| KR | 1020190130105 A | 11/2019 |

* cited by examiner

*Primary Examiner* — J. E. Schoenholtz
(74) *Attorney, Agent, or Firm* — CANTOR COLBURN LLP

(57) ABSTRACT

A display apparatus includes a substrate including a central area and a corner area including a plurality of extension areas, each of which has a shape extending in a direction away from the central area, and a plurality of ferromagnetic layers disposed in the plurality of extension areas and having a shape extending in the direction away from the central area.

20 Claims, 20 Drawing Sheets

DISPLAY APPARATUS AND METHOD OF MANUFACTURING THE SAME

This application claims priority to Korean Patent Application No. 10-2022-0064778, filed on May 26, 2022, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus in which a defect occurrence rate during a manufacturing process of the display apparatus may be reduced, and a method of manufacturing the display apparatus.

2. Description of the Related Art

In general, a display apparatus includes a plurality of pixels. The display apparatus may be a mobile electronic apparatus, and for example, may be a small-sized electronic device, such as a mobile phone and a tablet personal computer (PC).

As various components for driving the mobile electronic apparatus have become compact, a proportion occupied by a display unit in the mobile electronic apparatus has gradually increased, and a structure in which part of the display unit is bent has been developed.

SUMMARY

However, in display apparatuses of which a portion is bent, in the related art, the possibility that a defect occurs in a manufacturing process thereof is high.

One or more embodiments include a display apparatus in which a defect occurrence rate during a manufacturing process of the display apparatus may be reduced, and a method of manufacturing the display apparatus. However, the one or more embodiments are only examples, and the scope of the disclosure is not limited thereto.

According to an embodiment, a display apparatus includes a substrate including a central area and a corner area, where the corner area includes a plurality of extension areas, each of which has a shape extending in a direction away from the central area, and a plurality of ferromagnetic layers disposed in the plurality of extension areas and having a shape extending in the direction away from the central area.

In an embodiment, the substrate may further include a first adjacent corner area, which is located outside the central area and is adjacent to one side of the plurality of extension areas, and the display apparatus may further include a first adjacent ferromagnetic layer in the first adjacent corner area.

In an embodiment, the first adjacent ferromagnetic layer may have a shape extending in the direction away from the central area.

In an embodiment, an area of the first adjacent ferromagnetic layer may be in a range of about 80% to about 120% of an area of one of the plurality of ferromagnetic layers.

In an embodiment, an area of the first adjacent ferromagnetic layer may be in a range of about 80% to about 120% of the average area which is an average of areas of the plurality of ferromagnetic layers.

In an embodiment, the substrate may further include a second adjacent corner area, which is located outside the central area and adjacent to another side of the plurality of extension areas, and the display apparatus may further include a second adjacent ferromagnetic layer in the second adjacent corner area.

In an embodiment, each of the first adjacent ferromagnetic layer and the second adjacent ferromagnetic layer may have a shape extending in the direction away from the central area.

In an embodiment, an area of each of the first adjacent ferromagnetic layer and the second adjacent ferromagnetic layer may be in a range of about 80% to about 120% of an area of one of the plurality of ferromagnetic layers.

In an embodiment, an area of each of the first adjacent ferromagnetic layer and the second adjacent ferromagnetic layer may be in a range of about 80% to about 120% of the average area which is an average of areas of the plurality of ferromagnetic layers.

In an embodiment, the display apparatus may further include a plurality of insulating layers in each of the plurality of extension areas, where the plurality of insulating layers may be disposed on the substrate, and each of the plurality of ferromagnetic layers may be disposed between two adjacent insulating layers among the plurality of insulating layers.

In an embodiment, the display apparatus may further include a thin-film transistor in each of the plurality of extension areas, the thin-film transistor being disposed on the substrate, where each of the plurality of ferromagnetic layers is disposed on a lower surface of the substrate.

In an embodiment, the plurality of ferromagnetic layers and the plurality of extension areas may correspond to each other in a one-to-one manner.

In an embodiment, each of the plurality of ferromagnetic layers may be disposed in a corresponding one of the plurality of extension areas.

In an embodiment, ends of the plurality of ferromagnetic layers in a direction to the central area may be connected to each other.

In an embodiment, the plurality of ferromagnetic layers may be integrally formed as a single unitary body.

In an embodiment, the plurality of ferromagnetic layers may include iron (Fe), nickel (Ni), or cobalt (Co).

In an embodiment, the substrate may further include a first area adjacent to the central area in a first direction, and a second area adjacent to the central area in a second direction crossing the first direction, where the corner area at least partially surrounds the first area, the central area, and the second area.

In an embodiment, the substrate may be bent in the corner area, the first area, and the second area.

According to an embodiment, a method of manufacturing a display apparatus includes preparing a display panel which comprises a substrate and a plurality of ferromagnetic layers, where the substrate comprises a central area and a corner area, the corner area including a plurality of extension areas, each of which has a shape extending in a direction away from the central area, and where the plurality of ferromagnetic layers is disposed in the plurality of extension areas and each of the plurality of ferromagnetic layers has a shape extending in the direction away from the central area, magnetizing the plurality of ferromagnetic layers in a way such that an end of each of the plurality of ferromagnetic layers in the direction away from the central area has a same magnetism as each other, and bonding a cover window to the display panel.

In an embodiment, the method may further include disposing the display panel on a mold having a surface including a curved portion, where the bonding of the cover window to the display panel may include bonding the cover window to the display panel disposed on the mold.

These and/or other features of embodiments will become apparent and more readily appreciated from the following description of the embodiments, the claims, and the accompanying drawings.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
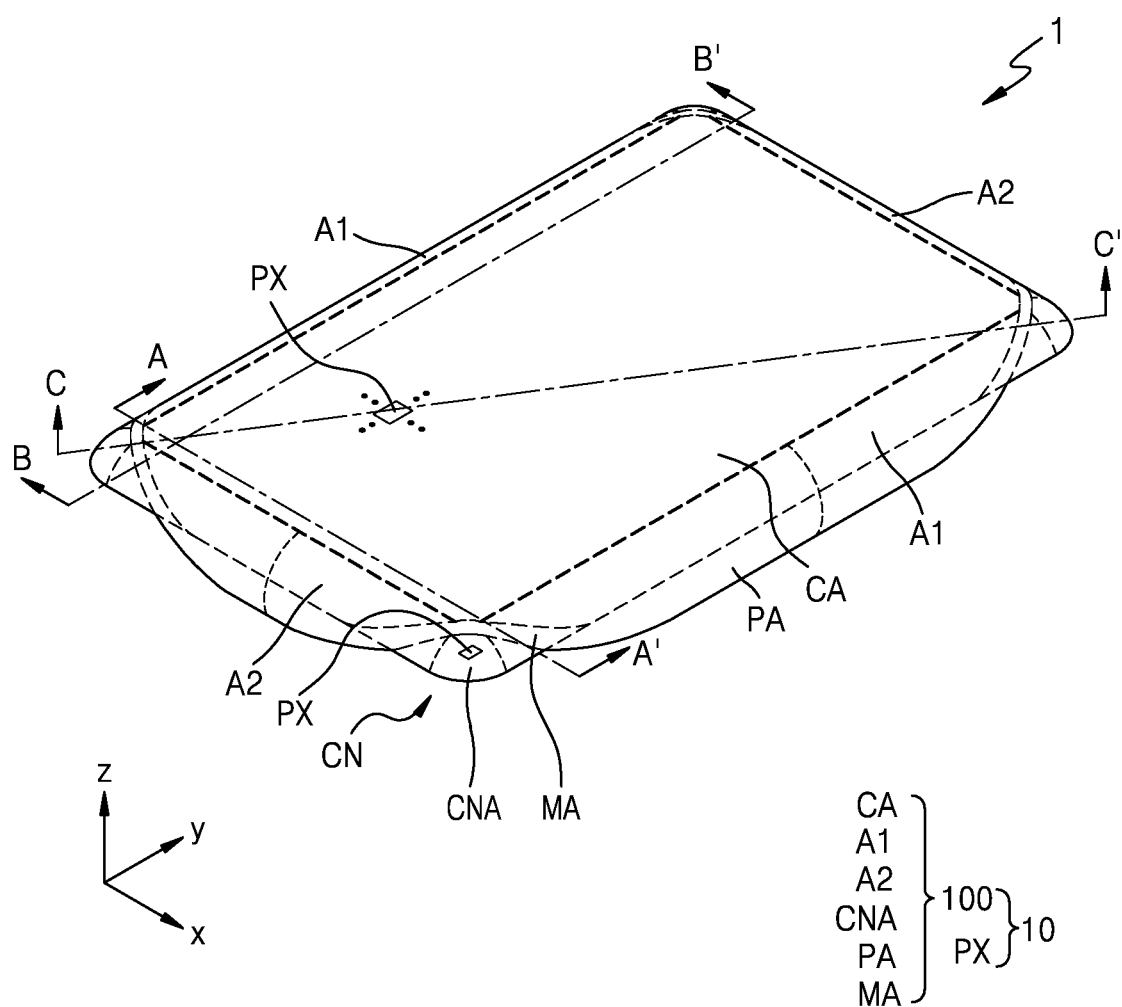
FIG. 1 is a perspective view schematically illustrating a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b, or c" or "at least one selected from a, b, and c" indicates only a, only b, only c, both a and b, both a and c, both b and c, all of a, b, and c, or any variations thereof.

It will be understood that when an element, such as a layer, a film, a region, or a plate, is referred to as being "on" another element, the element can be directly on the other element or intervening elements may be present therebetween. Sizes of elements in the drawings may be exaggerated or reduced for convenience of explanation. In other words, since sizes and thicknesses of elements in the drawings are arbitrarily illustrated for convenience of explanation, the following embodiments are not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, embodiments of the invention will be described in detail with reference to the accompanying drawings.

Figure 2A:
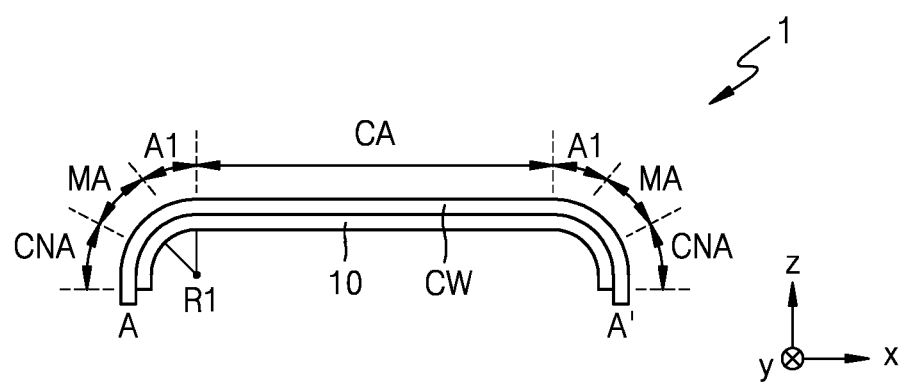
FIG. 2A is a cross-sectional view schematically illustrating a cross-section of the display apparatus, taken along line A-A' in FIG. 1.
Figure 2B:
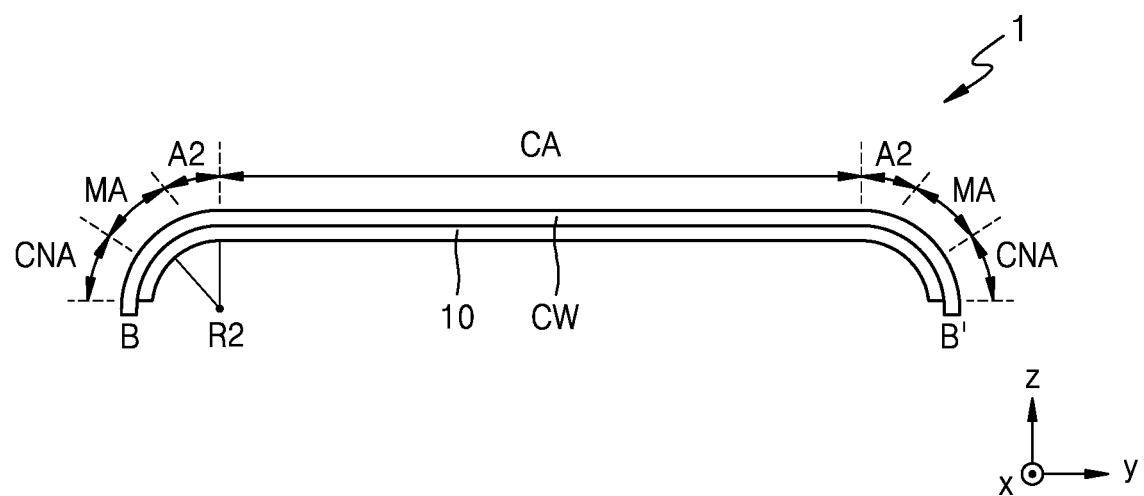
FIG. 2B is a cross-sectional view schematically illustrating a cross-section of the display apparatus, taken along line B-B' in FIG. 1.
Figure 2C:
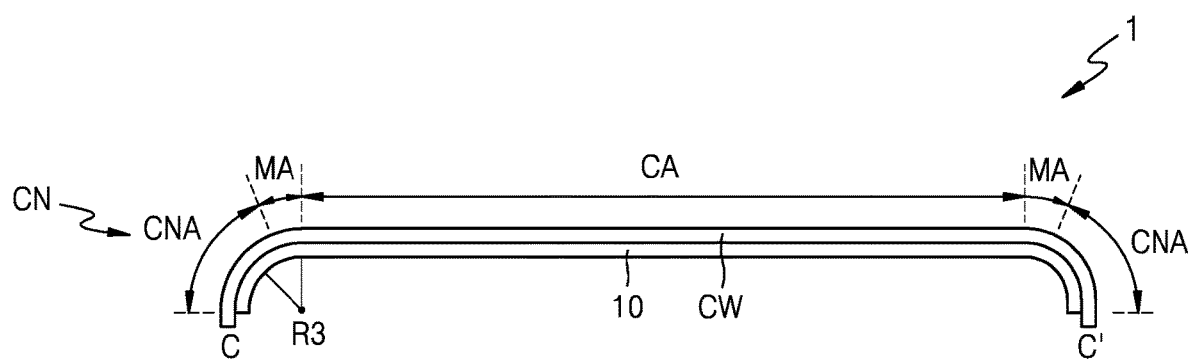
FIG. 2C is a cross-sectional view schematically illustrating a cross-section of the display apparatus, taken along line C-C' in FIG. 1.

FIG. 1 is a perspective view schematically illustrating a portion of a display apparatus 1 according to an embodiment, FIG. 2A is a cross-sectional view schematically illustrating a cross-section of the display apparatus 1, taken along line A-A' in FIG. 1, FIG. 2B is a cross-sectional view schematically illustrating a cross-section of the display apparatus 1, taken along line B-B' in FIG. 1, and FIG. 2C is a cross-sectional view schematically illustrating a cross-section of the display apparatus 1, taken along line C-C' in FIG. 1.

In embodiments, the display apparatus 1, which is an apparatus configured to display a moving image or a still image, may be portable electronic apparatuses, such as mobile phones, smartphones, tablet personal computers (PCs), mobile communication terminals, electronic notebooks, electronic books, portable multimedia players (PMPs), navigations device, or ultra-mobile PCs (UMPCs). In addition, the display apparatus 1 may be electronic apparatuses, such as televisions, laptop computers, monitors, advertisement boards, or Internet of things (IoT) device. Alternatively, the display apparatus 1 may be wearable devices, such as smartwatches, watchphones, glasses-type displays, or head-mounted displays (HMDs). Alternatively, the display apparatus 1 may be part of another apparatus. For example, the display apparatus 1 may be a display unit of any electronic apparatus. Alternatively, the display apparatus 1 may be an instrument panel for vehicles or center information display (CID) arranged on a center fascia or dashboard of a vehicle, a room mirror display replacing side-view mirrors of a vehicle, or a display unit arranged on a rear surface of a front seat as entertainment for back seats of a vehicle.

Referring to FIGS. 1 and 2A to 2C, an embodiment of the display apparatus 1, on which an image may be displayed, may have an edge extending in a first direction and an edge extending in a second direction. Here, the first direction and the second direction may be directions crossing each other. In an embodiment, for example, an angle formed by the first direction and the second direction may be an acute angle. Alternatively, an angle formed by the first direction and the second direction may be an obtuse angle or a right angle. A case in which the first direction and the second direction are perpendicular to each other is described below, for convenience of explanation. For example, the first direction may be an x direction or −x direction, and the second direction may be a y direction or −y direction.

A corner CN, at which the edge extending in the first direction (the x direction or −x direction) and the edge extending in the second direction (the y direction or −y direction) meet each other, may have a curvature.

The display apparatus 1 may include a cover window CW and a display panel 10. The cover window CW may perform a function of protecting the display panel 10. In an embodiment, the cover window CW may be arranged on the display panel 10. In an embodiment, the cover window CW may be a flexible window. The cover window CW may protect the display panel 10 by being easily bent by an external force. The cover window CW may include glass, sapphire, or plastic. The cover window CW may be ultra-thin glass. Alternatively, the cover window CW may include colorless polyimide.

The display panel 10 may be arranged under the cover window CW. In an embodiment, for example, the display panel 10 may be attached to the cover window CW by an adhesive (not shown) such as an optically clear adhesive (OCA).

The display panel 10 may be configured to display an image. The display panel may include a substrate 100 and a pixel PX. The display panel 10 may include a central area CA, a first area A1, a second area A2, a corner area CNA, an intermediate area MA, and a peripheral area PA. In an embodiment, for example, the substrate 100 included in the display panel 10 may include the central area CA, the first area A1, the second area A2, the corner area CNA, the intermediate area MA, and the peripheral area PA. In such an embodiment, the central area CA, the first area A1, the second area A2, the corner area CNA, the intermediate area MA, and the peripheral area PA may be defined on the substrate 100.

The central area CA may include an approximately flat area. The display apparatus 1 may provide most of images in the central area CA.

The first area A1 may be adjacent to the central area CA in the first direction (e.g., the x direction or −x direction). The first area A1 may extend in the second direction (e.g., they direction or −y direction). The display panel 10 may be bent in the first area A1. In an embodiment, the first area A1 may be defined as a bent area on a cross-section in the first direction (e.g., a zx cross-section), unlike the central area CA. In an embodiment, the first area A1 may be shown to be not bent on a cross-section in the second direction (e.g., an yz cross-section). In such an embodiment, the first area A1 may be an area that is bent with respect to an axis extending in the second direction.

In an embodiment, as shown in FIG. 2A, that the first area A1 located in the x direction from the central area CA and the first area A1 located in the −x direction from the central area CA have a same curvature as each other, but the disclosure is not limited thereto. In an alternative embodiment, for example, the first area A1 located in the x direction from the central area CA and the first area A1 located in the −x direction from the central area CA may have curvatures that are different from each other.

The second area A2 may be adjacent to the central area CA in the second direction. The second area A2 may extend in the first direction. The display panel 10 may be bent in the second area A2. In an embodiment, the second area A2 may be defined as a bent area on a cross-section in the second direction (e.g., the yz cross-section), unlike the central area CA, and the second area A2 may be shown to be not bent on a cross-section in the first direction (e.g., the zx cross-section). In such an embodiment, the second area A2 may be an area that is bent with respect to an axis extending in the first direction.

In an embodiment, as shown in FIG. 2B, the second area A2 located in the y direction from the central area CA and the second area A2 located in the −y direction from the central area CA have a same curvature as each other, but the disclosure is not limited thereto. In an alternative embodiment, for example, the second area A2 located in the y direction from the central area CA and the second area A2 located in the −y direction from the central area CA may have curvatures that are different from each other.

The display panel 10 may be bent in the corner area CNA. The corner area CNA may be an area arranged at the corner CN. In an embodiment, the corner area CNA may be an area in which an edge of the display apparatus 1 in the first direction and an edge of the display apparatus 1 in the second direction meet each other. The corner area CNA may at least partially surround the central area CA, the first area A1, and the second area A2. Alternatively, the corner area CNA may at least partially surround the central area CA, the first area A1, the second area A2, and the intermediate area MA.

In an embodiment where the first area A1 extends in the second direction and is bent on a cross-section in the first direction (e.g., the zx cross-section) and the second area A2 extends in the first direction and is bent on a cross-section in the second direction (e.g., the yz cross-section), at least part of the corner area CNA is bent on all of the cross-section in the first direction (e.g., the zx cross-section) and the cross-section in the second direction (e.g., the yz cross-section). In such an embodiment, the at least part of the corner area CNA may be a double curved area, in which a plurality of curvatures in a plurality of directions overlap each other. The display apparatus 1 may include a plurality of corner areas CNA.

The intermediate area MA may be located between the central area CA and the corner area CNA. The intermediate area MA may extend in an extension direction of the first area A1 between the first area A1 and the corner area CNA. In addition, the intermediate area MA may extend in an extension direction of the second area A2 between the second area A2 and the corner area CNA. The intermediate area MA may be bent. In addition, in the intermediate area MA, a driving circuit configured to provide an electronic signal to the pixel PX and a power line configured to provide power to the pixel PX may be arranged. In an embodiment, the pixel PX arranged in the intermediate area MA may overlap the driving circuit and/or the power line.

The peripheral area PA may be located outside the central area CA. In an embodiment, for example, the peripheral area PA may be located outside the first area A1 and the second area A2. The pixel PX may not be arranged in the peripheral area PA. In such an embodiment, the peripheral area PA may be a non-display area, in which an image is not displayed. In the peripheral area PA, a driving circuit configured to provide an electrical signal to the pixel PX or a power line configured to provide power to the pixel PX may be arranged.

In an embodiment, as shown in FIG. 2A, the first area A1, the intermediate area MA, and a portion of the corner area CNA may be bent with a first curvature radius R1. In an embodiment, as shown in FIG. 2B, the second area A2, the intermediate area MA, and another portion of the corner area CNA may be bent with a second curvature radius R2. In an embodiment, yet another portion of the corner area CNA and the intermediate area MA may be bent with a third curvature radius R3, as shown in FIG. 2C.

The pixel PX may be disposed on the substrate 100. In an embodiment, the pixel PX may be implemented by a display element DPE (see FIGS. 4 and 6). Each pixel PX may include a red sub-pixel, a green sub-pixel, and a blue sub-pixel. Alternatively, each pixel PX may include a red sub-pixel, a green sub-pixel, a blue sub-pixel, and a white sub-pixel.

The pixel PX may be arranged in at least one of the central area CA, the first area A1, the second area A2, and the corner area CNA. In an embodiment, for example, a plurality of pixels PX may be arranged in the central area CA, the first area A1, the second area A2, the corner area CNA, and the intermediate area MA. Accordingly, the display apparatus 1 may display an image in the central area CA, the first area A1, the second area A2, the corner area CNA, and the intermediate area MA. In an embodiment, the display apparatus 1 may provide independent images in the central area CA, the first area A1, the second area A2, the corner area CNA, and the intermediate area MA, respectively. Alternatively, the display apparatus 1 may provide portions of any one image in the central area CA, the first area A1, the second area A2, the corner area CNA, and the intermediate area MA, respectively.

In an embodiment, as described above, the display apparatus 1 may display an image not only in the central area CA, but also in the first area A1, the second area A2, the intermediate area MA, and the corner area CNA. Thus, an area of a display area in the display apparatus 1, where the display area is an area in which an image is displayed, may be substantially increased. In such an embodiment, the display apparatus 1 may display an image even at the corner CN that is bent, and thus, aesthetics appeal thereof may be improved.

Figure 3:
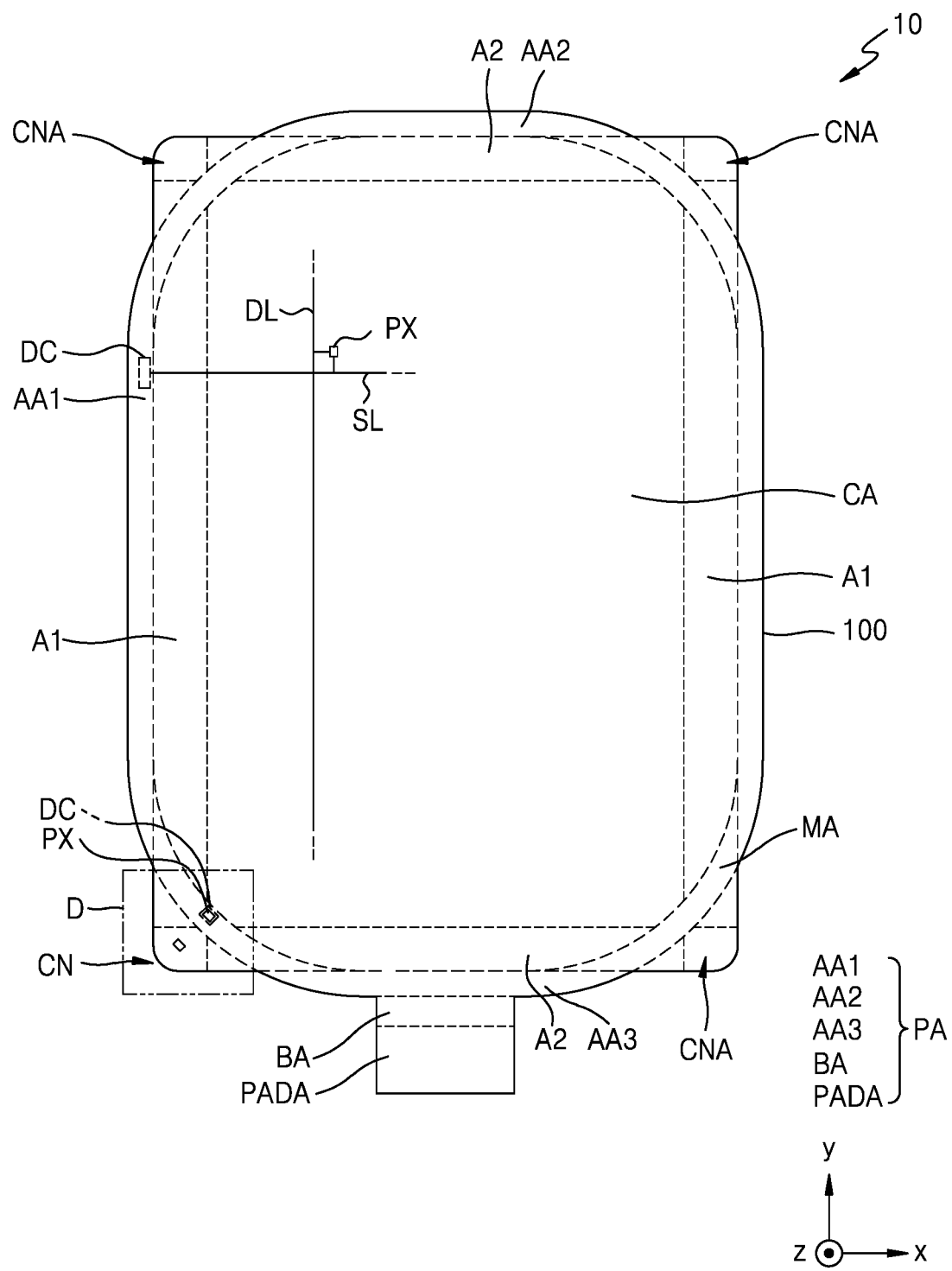
FIG. 3 is a plan view schematically illustrating a portion of the display apparatus in FIG. 1.

FIG. 3 is a plan view schematically illustrating the display panel 10 that is a portion of the display apparatus 1 in FIG. 1. In FIG. 3, for convenience of description, an embodiment in which the display panel 10 is in an unfolded state with no bent portions is schematically shown.

In an embodiment, as described above, the peripheral area PA may be arranged outside the central area CA. The peripheral area PA may include a first adjacent area AA1, a second adjacent area AA2, a third adjacent area AA3, a bending area BA, and a pad area PADA.

The first adjacent area AA1 may be located outside the first area A1. In an embodiment, the first area A1 may be located between the first adjacent area AA1 and the central area CA. Accordingly, the first adjacent area AA1 may be located in the first direction from the first area A1, and may extend in the second direction, similar to the first area A1. A driving circuit DC and/or a power line may be arranged in the first adjacent area AA1.

The second adjacent area AA2 and the third adjacent area AA3 may be located outside the second area A2. In an embodiment, the second areas A2 may be located between the second adjacent area AA2 and the central area CA and between the third adjacent area AA3 and the central area CA. Similar to the second area A2, each of the second adjacent area AA2 and the third adjacent area AA3 may extend in the first direction. The second areas A2 and the central area CA may be between the second adjacent area AA2 and the third adjacent area AA3.

The bending area BA may be located outside the third adjacent area AA3. In an embodiment, the third adjacent area AA3 may be located between the bending area BA and the second area A2. In addition, the pad area PADA may be arranged outside the bending area BA. In such an embodiment, the bending area BA may be located between the third adjacent area AA3 and the pad area PADA. The display panel 10 may be bent in the bending area BA. In such an embodiment, the pad area PADA may overlap another portion of the display panel 10. Thus, an area of the peripheral area PA that is visible to a user may be minimized. A pad (not shown) may be arranged in the pad area PADA. The display panel 10 may receive an electrical signal and/or a power voltage via the pad.

In FIG. 3, the display panel 10 is shown in an unfolded state without being bent. However, the display panel 10 may be bent in a portion thereof, as described above. In such an embodiment, at least one of the first area A1, the second area A2, the corner area CNA, and the intermediate area MA is bendable.

In an embodiment, for example, the first area A1 may be bent with respect to an axis extending in the second direction, and may be shown to be bent on the cross-section in the first direction (e.g., the zx cross-section) and not to be bent on the cross-section in the second direction (e.g., the yz cross-section). The second area A2 may be bent with respect to an axis extending in the first direction, and may be shown to be bent on the cross-section in the second direction (e.g., the yz cross-section) and not to be bent on the cross-section in the first direction (e.g., the zx cross-section). At least part of the corner area CNA is bent on all of the cross-section in the first direction (e.g., the zx cross-section) and the cross-section in the second direction (e.g., the yz cross-section), and thus, the at least part of the corner area CNA may be a double curved area, in which a plurality of curvatures in a plurality of directions overlap each other.

In a state where the corner area CNA is bent as described above, a compressive strain greater than a tensile strain may occur in the corner area CNA. Accordingly, in an embodiment, the substrate 100 may be contractible in the at least part of the corner area CNA. As a result, a structure of the display panel 10 in the corner area CNA may be different from a structure of the display panel 10 in the central area CA.

The pixel PX, which may be arranged in at least one selected from the central area CA, the first area A1, the second area A2, the corner area CNA, and the intermediate area MA, as described above, may include a display element. The display element may be an organic light-emitting diode including an organic emission layer. Alternatively, the display element may be a light-emitting diode (LED) including an inorganic emission layer. A size of the LED may be on a microscale or a nanoscale. In an embodiment, for example, the LED may be a micro LED. Alternatively, the LED may be a nanorod LED. The nanorod LED may include gallium nitride (GaN). In an embodiment, a color conversion layer may be disposed on the display element. In such an embodiment, the color conversion layer may include quantum dots.

Alternatively, the display element may be a quantum dot light-emitting diode including a quantum dot emission layer. Hereinafter, embodiments in which the display element includes an organic light-emitting diode is described for convenience of description.

The pixel PX may include a plurality of sub-pixels, and each of the plurality of sub-pixels may emit light of a color by using the display element. The sub-pixel, which is a smallest unit for implementing an image, refers to an emission area. In an embodiment where the organic light-emitting diode is used as the display element, the emission area may be defined by an opening of a pixel-defining layer. This will be described later.

The driving circuit DC may provide signals to the pixels PX. In an embodiment, for example, the driving circuit DC may be a scan driving circuit configured to provide a scan signal to pixel circuits via a scan line SL, where the pixel circuits are electrically connected to the sub-pixels included in the pixel PX. Alternatively, the driving circuit DC may be an emission control driving circuit configured to provide an emission control signal via an emission control line (not shown) to the pixel circuits electrically connected to the sub-pixels. Alternatively, the driving circuit DC may be a data driving circuit configured to provide a data signal via a data line DL to the pixel circuits electrically connected to the sub-pixels. Although not shown, the data driving circuit may be arranged in the third adjacent area AA3 or in the pad area PADA. Alternatively, the data driving circuit may be disposed on a display circuit board connected to the display panel 10 via the pad.

Figure 4:
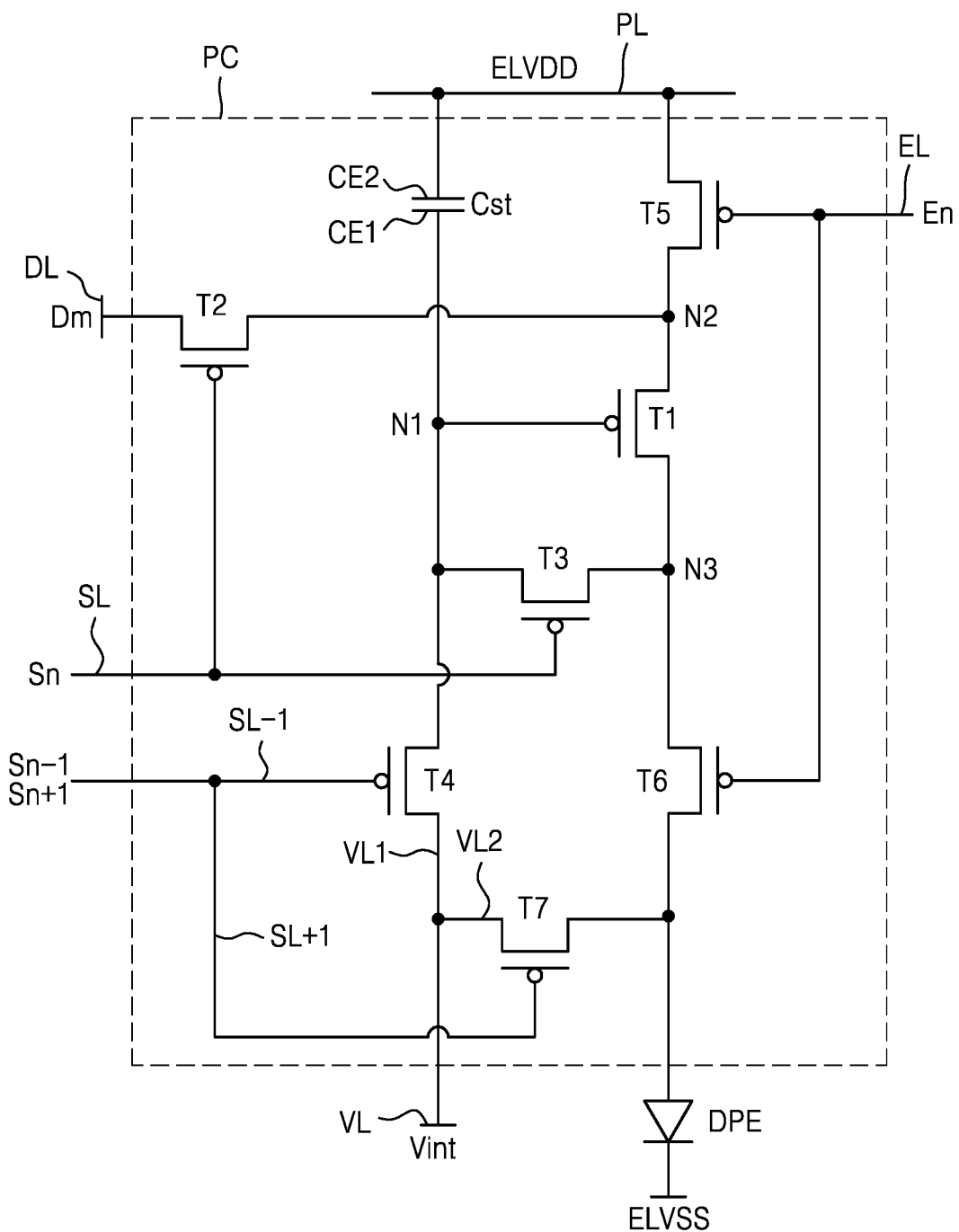
FIG. 4 is an equivalent circuit diagram illustrating an embodiment of a pixel circuit included in the display apparatus in FIG. 1.

FIG. 4 is an equivalent circuit diagram illustrating an embodiment of a pixel circuit PC included in the display apparatus 1 in FIG. 1. Particularly, FIG. 4 is an equivalent circuit diagram of the pixel circuit PC electrically connected to an organic light-emitting diode that is a display element DPE forming one sub-pixel included in the display apparatus 1 in FIG. 1. The pixel circuit PC electrically connected to a single sub-pixel may include a plurality of thin-film transistors T1 to T7 and a storage capacitor Cst. The thin-film transistors T1 to T7 and the storage capacitor Cst may be connected to signal lines SL, SL−1, SL+1, EL, and DL, a first initialization voltage line VL1, a second initialization voltage line VL2, and a power voltage line PL.

The signal lines SL, SL−1, SL+1, EL, and DL may include the scan line SL configured to transfer a scan signal Sn, a previous scan line SL−1 configured to transfer a previous scan signal Sn−1 to the initialization thin-film transistor T4, a next scan line SL+1 configured to transfer a scan signal Sn+1 to the second initialization thin-film transistor T7, an emission control line EL configured to transfer an emission control signal En to the operation control thin-film transistor T5 and the emission control thin-film transistor T6, and the data line DL, which crosses the scan line SL and is configured to transfer a data signal Dm. The power voltage line PL may be configured to transfer a driving voltage ELVDD to the driving thin-film transistor T1, the first initialization voltage line VL1 may be configured to transfer an initialization voltage Vint to the first initialization thin-film transistor T4, and the second initialization voltage line VL2 may be configured to transfer the initialization voltage Vint to the second initialization thin-film transistor T7.

A driving gate electrode G1 (see FIG. 5), which is a first gate electrode of the driving thin-film transistor T1 that is a first transistor, may be connected to a lower electrode CE1 of the storage capacitor Cst, a driving source area S1 (see FIG. 5) of the driving thin-film transistor T1 may be connected to the power voltage line PL via the operation control thin-film transistor T5, and a driving drain area D1 (see FIG. 5) of the driving thin-film transistor T1 may be electrically connected via the emission control thin-film transistor T6 to a pixel electrode of the organic light-emitting diode that is the display element DPE. In such an embodiment, the driving thin-film transistor T1 may control an amount of current that flows from a second node N2 connected to the power voltage line PL to the organic light-emitting diode as the display element DPE, in response to a voltage applied to a first node N1, i.e., a voltage applied to the driving gate electrode G1 of the driving thin-film transistor T1. Accordingly, the driving thin-film transistor T1 may receive the data signal Dm in response to a switching operation of the switching thin-film transistor T2 and supply a driving current to the organic light-emitting diode as the display element DPE. The operation control thin-film transistor T5 may be located between the second node N2 and the power voltage line PL.

A switching gate electrode G2 (see FIG. 5), which is a second gate electrode of the switching thin-film transistor T2 that is a second transistor, may be connected to the scan line SL, a switching source area S2 (see FIG. 5) of the switching thin-film transistor T2 may be connected to the data line DL, and a switching drain area D2 (see FIG. 5) of the switching thin-film transistor T2 may be connected to the power voltage line PL via the operation control thin-film transistor T5 by being connected to the second node N2 and the driving source area S1 of the driving thin-film transistor T1. The switching thin-film transistor T2 may be turned on in response to the scan signal Sn received via the scan line SL and perform a switching operation for transferring the data signal Dm received via the data line DL to the driving source area S1 of the driving thin-film transistor T1.

The compensation thin-film transistor T3, which is connected between a third node N3 and the first node N1 as a third transistor, where the third node N3 is between the driving thin-film transistor T1 and the organic light-emitting diode as the display element DPE, may diode-connect the driving thin-film transistor T1 in response to a voltage applied to a compensation gate electrode G3 (see FIG. 5) that is a third gate electrode. In such an embodiment, the compensation gate electrode G3 of the compensation thin-film transistor T3 may be connected to the scan line SL, a compensation drain area D3 (see FIG. 5) of the compensation thin-film transistor T3 may be connected to the pixel electrode of the organic light-emitting diode as the display element DPE via the emission control thin-film transistor T6 by being connected to the driving drain area D1 of the driving thin-film transistor T1, and a compensation source area S3 (see FIG. 5) of the compensation thin-film transistor T3 may be connected to the lower electrode CE1 of the storage capacitor Cst, a first initialization drain area D4 (see FIG. 5) of the first initialization thin-film transistor T4, and the driving gate electrode G1 of the driving thin-film transistor T1.

The compensation thin-film transistor T3 may be turned on in response to the scan signal Sn received via the scan line SL and electrically connect the driving gate electrode G1 to the driving drain area D1 of the driving thin-film transistor T1, thereby diode-connecting the driving thin-film transistor T1. Accordingly, even in a case where threshold voltages of the driving thin-film transistors T1 of a plurality of pixel circuits PC are different from each other, driving currents flowing through the organic light-emitting diodes may have a substantially same magnitude as each other by applying a same data signal Dm to the plurality of pixel circuits PC. In an embodiment, the compensation thin-film transistor T3 described above may include a dual gate electrode.

The first initialization thin-film transistor T4 as a fourth transistor may be connected between the first node N1 and the first initialization voltage line VL1 and initialize a voltage of the driving gate electrode G1 of the driving thin-film transistor T1 in response to a voltage applied to a first initialization gate electrode G4 (see FIG. 5) that is a fourth gate electrode. In such an embodiment, the first initialization gate electrode G4 of the first initialization thin-film transistor T4 may be connected to the previous scan line SL−1, a first initialization source area S4 (see FIG. 5) of the first initialization thin-film transistor T4 may be connected to the first initialization voltage line VL1, and the first initialization drain area D4 of the first initialization thin-film transistor T4 may be connected to the lower electrode CE1 of the storage capacitor Cst, the compensation source area S3 of the compensation thin-film transistor T3, and the driving gate electrode G1 of the driving thin-film transistor T1. The first initialization thin-film transistor T4 may be turned on in response to the previous scan signal Sn−1 received via the previous scan line SL−1 and perform an initialization operation for transferring the initialization voltage Vint to the driving gate electrode G1 of the driving thin-film transistor T1 and initializing the voltage of the driving gate electrode G1 of the driving thin-film transistor T1.

The operation control thin-film transistor T5 as a fifth transistor may be connected between the second node N2 and the power voltage line PL, and be turned on in response to a voltage applied to an operation control gate electrode G5 (see FIG. 5) that is a fifth gate electrode. In such an embodiment, the operation control gate electrode G5 of the operation control thin-film transistor T5 may be connected to the emission control line EL, an operation control source area S5 (see FIG. 5) of the operation control thin-film transistor T5 may be connected to the power voltage line PL, and an operation control drain area D5 (see FIG. 5) of the operation control thin-film transistor T5 may be connected to the driving source area S1 of the driving thin-film transistor T1 and the switching drain area D2 of the switching thin-film transistor T2.

The emission control thin-film transistor T6 as a sixth transistor may be connected between the third node N3 and the display element DPE, and be turned on in response to a voltage applied via the emission control line EL to an emission control gate electrode G6 (see FIG. 5) that is a sixth gate electrode. In such an embodiment, the emission control gate electrode G6 of the emission control thin-film transistor T6 may be connected to the emission control line EL, an emission control source area S6 (see FIG. 5) of the emission control thin-film transistor T6 may be connected to the driving drain area D1 of the driving thin-film transistor T1 and the compensation drain area D3 of the compensation thin-film transistor T3, and an emission control drain area D6 (see FIG. 5) of the emission control thin-film transistor T6 may be electrically connected to a second initialization source area S7 (see FIG. 5) of the second initialization thin-film transistor T7 and the display element DPE.

The operation control thin-film transistor T5 and the emission control thin-film transistor T6 may be turned on simultaneously with each other in response to the emission control signal En received via the emission control line EL, so that the driving voltage ELVDD is transferred to the organic light-emitting diode as the display element DPE and the driving current flows through the organic light-emitting diode.

A second initialization gate electrode G7 (see FIG. 5), which is a seventh gate electrode of the second initialization thin-film transistor T7 that is a seventh transistor, may be connected to the next scan line SL+1, the second initialization source area S7 of the second initialization thin-film transistor T7 may be connected to the emission control drain area D6 of the emission control thin-film transistor T6 and the display element DPE, and a second initialization drain area D7 (see FIG. 5) of the second initialization thin-film transistor T7 may be connected to the second initialization voltage line VL2.

When the scan line SL and the next scan line SL+1 are electrically connected to each other, the same scan signal Sn may be applied to the scan line SL and the next scan line SL+1. In this case, the second initialization thin-film transistor T7 may be turned on in response to the scan signal Sn received via the next scan line SL+1 and perform an operation for initializing the pixel electrode of the organic light-emitting diode that is the display element DPE. In an alternative embodiment, the second initialization thin-film transistor T7 may be omitted.

An upper electrode CE2 of the storage capacitor Cst may be connected to the power voltage line PL, and a common electrode of the organic light-emitting diode as the display element DPE may be connected to a line configured to transfer a common voltage ELVSS. Accordingly, the organic light-emitting diode may receive a driving current from the driving thin-film transistor T1, emit light, and display an image.

As described above, the compensation thin-film transistor T3 may include a dual gate electrode. In other words, the compensation thin-film transistor T3 may include two compensation gate electrodes G3. In an alternative embodiment, the first initialization thin-film transistor T4 may also include a dual gate electrode.

Figure 5:
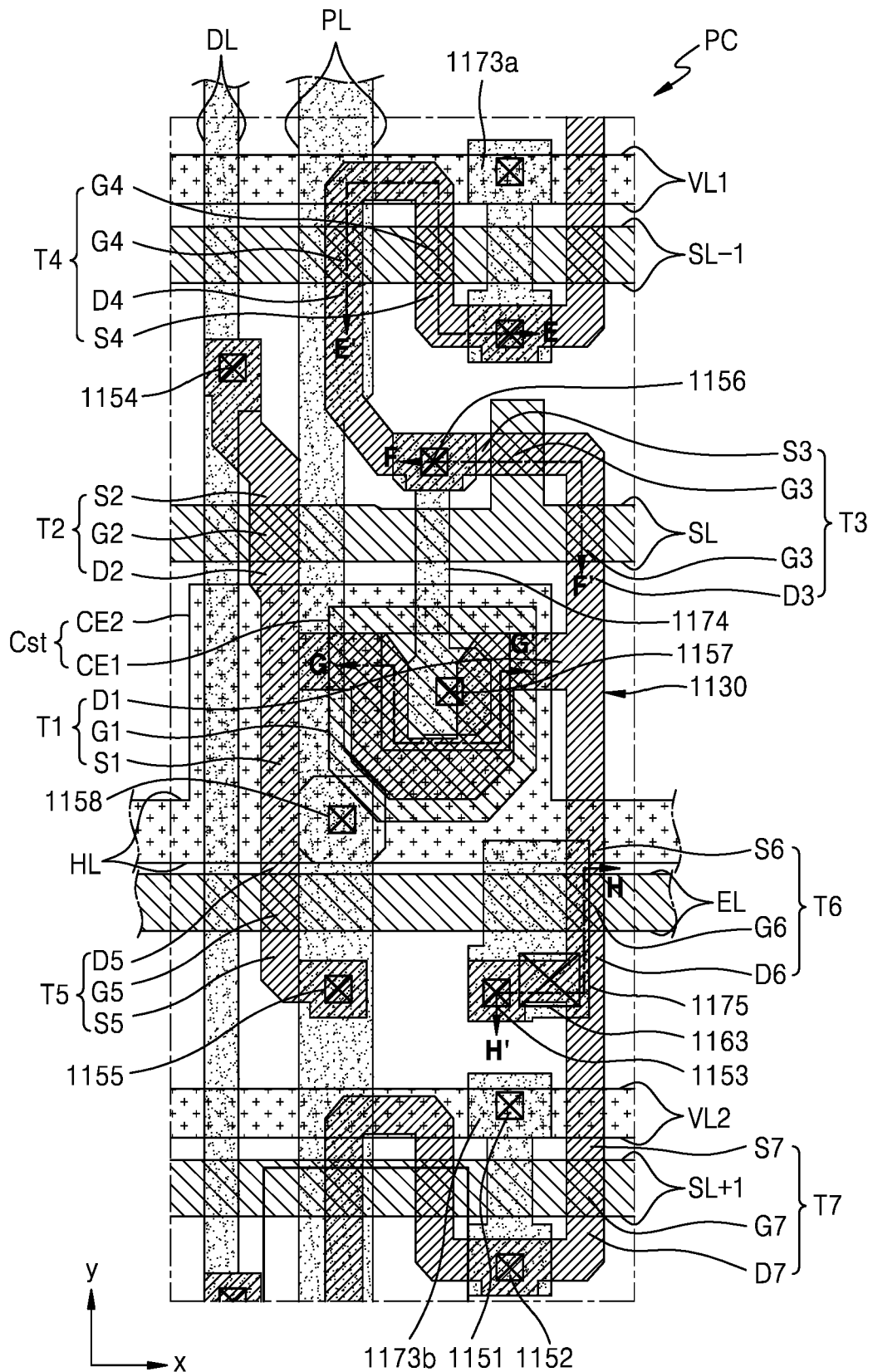
FIG. 5 is a plan view schematically illustrating an embodiment of a pixel circuit included in the display apparatus in FIG. 1.
Figure 6:
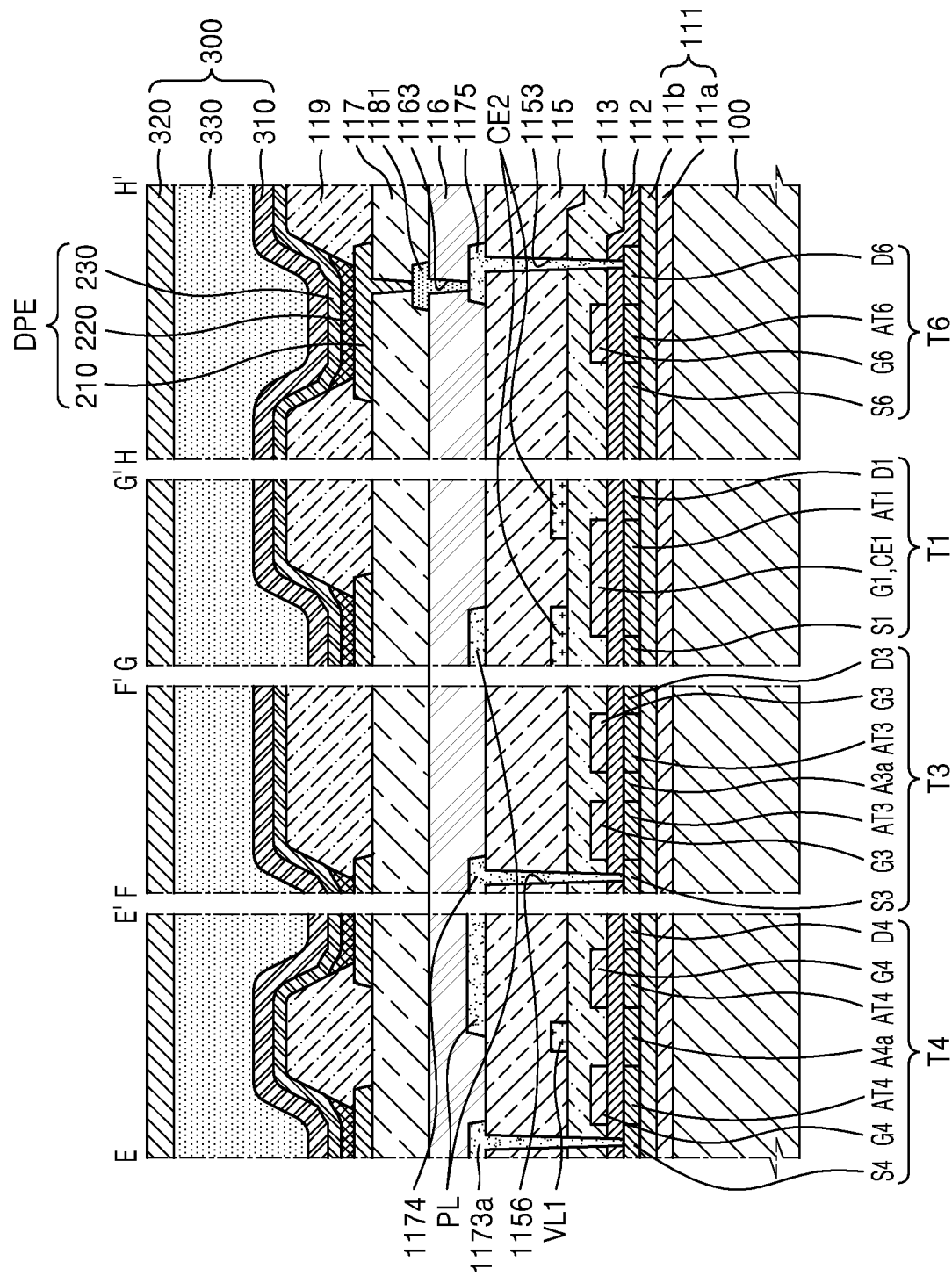
FIG. 6 is a cross-sectional view schematically illustrating cross-sections of the display apparatus, taken along lines E-E', F-F', G-G', and H-H' in FIG. 5.

FIG. 5 is a plan view schematically illustrating an embodiment of a pixel circuit PC arranged in the central area CA of the display panel 10 included in the display apparatus 1 in FIG. 1, in which locations of a plurality of thin-film transistors, a capacitor, etc. are schematically shown. FIG. 6 is a cross-sectional view schematically illustrating cross-sections of the display apparatus 1, taken along lines E-E', F-F', G-G', and H-H' in FIG. 5. In the corresponding cross-sectional view, a dimension of each of the elements is exaggerated and/or reduced for convenience of explanation. This also applies to cross-sectional views to be described later.

The driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be arranged along a semiconductor layer 1130. Some areas of the semiconductor layer 1130 may constitute semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In such an embodiment, some areas of the semiconductor layer 1130 may constitute an active area, a source area, or a drain area of a thin-film transistor.

The semiconductor layer 1130 may be defined or formed on the substrate 100. In addition, a buffer layer 111 may be defined or formed on the substrate 100, and the semiconductor layer 1130 may be defined or formed on the buffer layer 111.

The substrate 100 may include polymer resin, such as polyether sulfone, polyarylate, polyether imide, polyethylene naphthalate, polyethylene terephthalate, polyphenylene sulfide, polyimide, polycarbonate, cellulose triacetate, or cellulose acetate propionate. Alternatively, the substrate 100 may include two layers and a barrier layer located therebetween, where the two layers includes the polymer resin described above. In such an embodiment, the barrier layer may include an inorganic material, such as silicon nitride ($SiN_x$), silicon oxide ($SiO_2$), and/or silicon oxynitride ($Si-O_xN_y$). Alternatively, the substrate 100 may include glass or metal.

The buffer layer 111 may reduce or block permeation of foreign materials, moisture, or external air from below the substrate 100 and provide a flat surface on the substrate 100. The buffer layer 111 may include an inorganic material, such as an oxide or nitride, an organic material, or an organic inorganic compound, and may have a single-layered or multi-layered structure of an inorganic material and/or an organic material. In an embodiment, for example, the buffer layer 111 may have a stacked structure of a first buffer layer 111a and a second buffer layer 111b, and in such an embodiment, the first buffer layer 111a and the second buffer layer 111b may include materials that are different from each other. In an embodiment, for example, the first buffer layer 111a may include $SiN_x$, and the second buffer layer 111b may include $SiO_2$.

In an embodiment where the first buffer layer 111a includes $SiN_x$, as described above, hydrogen may be included in $SiN_x$ when $SiN_x$ is formed. Accordingly, the carrier mobility of the semiconductor layer 1130 disposed or formed on the buffer layer 111 may be improved, and electrical characteristics of a thin-film transistor may be improved. In addition, the semiconductor layer 1130 may include a silicon material such that interfacial bonding characteristics between the semiconductor layer 1130 and the second buffer layer 111b are improved, where the semiconductor layer 1130 includes silicon, the second buffer layer 111b includes $SiO_2$, and the electrical characteristics of the thin-film transistor may be improved.

The semiconductor layer 1130 may include low-temperature polysilicon (LTPS). The polysilicon material has high electron mobility (100 cm²/Vs or more), low energy consumption, and high reliability. In an alternative embodiment, for example, the semiconductor layer 1130 may also include amorphous silicon (a-Si) and/or oxide semiconductor. Alternatively, among a plurality of thin-film transistors, some semiconductor layers may include LTPS, and other semiconductor layers may include a-Si and/or oxide semiconductor.

Source areas and drain areas of the semiconductor layer 1130 may be doped with impurities, and the impurities may include an N-type impurity or a P-type impurity. The source area and the drain area may correspond to a source electrode and a drain electrode, respectively. The source area and the drain area may be reversed according to properties of the thin-film transistor. Hereinafter, the terms "source area" and "drain area" are used instead of "source electrode" or "drain electrode." In the equivalent circuit diagram of FIG. 4, it is shown that specific portions of the semiconductor layer 1130 are doped with P-type impurities, and the thin-film transistors are implemented as p-channel metal-oxide-semiconductor field-effect transistors (MOSFETs; PMOSs). In addition, other portions of the semiconductor layer 1130 may also be doped with impurities and serve as a line that electrically connects the thin-film transistors and/or the capacitor to each other.

A first gate insulating layer 112 is disposed on the semiconductor layer 1130, and the driving gate electrode G1, the scan line SL, the previous scan line SL−1, the next scan line SL+1, and the emission control line EL may be disposed on the first gate insulating layer 112. Such elements disposed on the first gate insulating layer 112 may be collectively referred to as a first gate layer. The first gate insulating layer 112 may include $SiO_2$, $SiN_x$, $SiO_xN_y$, aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

A portion of the semiconductor layer 1130 that overlaps the driving gate electrode G1 of the driving thin-film transistor T1 may be an active area AT1 (see FIG. 6) of the driving thin-film transistor T1. Portions of the scan line SL that overlap the semiconductor layer 1130 may be the switching gate electrode G2 of the switching thin-film transistor T2 and the compensation gate electrode G3 of the compensation thin-film transistor T3, a portion of the previous scan line SL−1 that overlaps the semiconductor layer 1130 may be the first initialization gate electrode G4 of the first initialization thin-film transistor T4, a portion of the next scan line SL+1 that overlaps the semiconductor layer 1130 may be the second initialization gate electrode G7 of the second initialization thin-film transistor T7, and portions of the emission control line EL that overlap the semiconductor layer 1130 may be the operation control gate electrode G5 of the operation control thin-film transistor T5 and the emission control gate electrode G6 of the emission control thin-film transistor T6. In an embodiment where the first initialization thin-film transistor T4 includes a dual gate electrode, the first initialization thin-film transistor T4 may include two active areas AT4 and an area A4a therebetween, as shown in FIG. 6. In an embodiment, where the compensation thin-film transistor T3 includes a dual gate electrode, the compensation thin-film transistor T3 may have two active areas AT3 (see FIG. 6) and an area A3a therebetween, as shown in FIG. 6. For reference, the emission control thin-film transistor T6 includes one emission control gate electrode G6 and thus may have one active area AT6, as shown in FIG. 6.

Each of the driving gate electrode G1, the scan line SL, the previous scan line SL−1, the next scan line SL+1, and the emission control line EL may include a conductive material, including molybdenum (Mo), aluminum (Al), copper (Cu), or titanium (Ti), and may have a multi-layer or single-layer structure including the material. In an embodiment, for example, each of the driving gate electrode G1, the scan line SL, the previous scan line SL−1, the next scan line SL+1, and the emission control line EL may have a multi-layer structure of a Mo layer and an Al layer, or may have a multi-layer structure of a Mo layer, an Al layer, and another Mo layer.

A second gate insulating layer 113 may be disposed or provided on the driving gate electrode G1, the scan line SL, the previous scan line SL−1, the next scan line SL+1, and the emission control line EL. The second gate insulating layer 113 may include $SiO_2$, $SiN_x$, $SiO_xN_y$, $Al_2O_3$, $TiO_2$, $Ta_2O_5$, $HfO_2$, or ZnO or $ZnO_2$.

A horizontal voltage line HL, the first initialization voltage line VL1, and the second initialization voltage line VL2 may be disposed on the second gate insulating layer 113. Such elements disposed on the second gate insulating layer 113 may be collectively referred to as a second gate layer. The horizontal voltage line HL may overlap at least part of the driving gate electrode G1 and form the storage capacitor Cst together with the driving gate electrode G1.

The lower electrode CE1 of the storage capacitor Cst may be integrally formed as a single unitary and indivisible body with the driving gate electrode G1 of the driving thin-film transistor T1. In an embodiment, for example, the driving gate electrode G1 of the driving thin-film transistor T1 may function as the lower electrode CE1 of the storage capacitor Cst. An area of the horizontal voltage line HL that overlaps the driving gate electrode G1 of the driving thin-film transistor T1 may be the upper electrode CE2 of the storage capacitor Cst. Accordingly, the second gate insulating layer 113 may function as a dielectric layer of the storage capacitor Cst.

Each of the horizontal voltage line HL, the first initialization voltage line VL1, and the second initialization voltage line VL2 may include a conductive material, including Al, platinum (Pt), palladium (Pd), silver (Ag), magnesium (Mg), gold (Au), nickel (Ni), neodymium (Nd), iridium (Ir), chrome (Cr), calcium (Ca), Mo, Ti, tungsten (W), or Cu, and may have a multi-layer or single-layer structure including the material. In an embodiment, for example, each of the horizontal voltage line HL, the first initialization voltage line VL1, and the second initialization voltage line VL2 may have a multi-layer structure of a Mo layer and an Al layer, or may have a multi-layer structure of a Mo layer, an Al layer, and another Mo layer.

An interlayer insulating layer 115 may be disposed on the horizontal voltage line HL, the first initialization voltage line VL1, and the second initialization voltage line VL2. The interlayer insulating layer 115 may include $SiO_2$, $SiN_x$, $SiO_xN_y$, $Al_2O_3$, $TiO_2$, $Ta_2O_5$, $HfO_2$, or ZnO or $ZnO_2$.

The data line DL, the power voltage line PL, first and second initialization connection lines 1173a and 1173b, a node connection line 1174, and a connection metal 1175 may be disposed on the interlayer insulating layer 115. Such elements disposed on the interlayer insulating layer 115 may be collectively referred to as a first source drain layer. Each of the data line DL, the power voltage line PL, first and second initialization connection lines 1173a and 1173b, the node connection line 1174, and the connection metal 1175 may include a conductive material, including Mo, Al, Cu, or Ti, and may have a multi-layer or single-layer structure including the material. In an embodiment, for example, each of the data line DL, the power voltage line PL, first and second initialization connection lines 1173a and 1173b, the node connection line 1174, and the connection metal 1175 may have a multi-layer structure of a Ti layer, an Al layer, and another Ti layer.

The data line DL may be connected to the switching source area S2 of the switching thin-film transistor T2 via a contact hole 1154. In an embodiment, part of the data line DL may define a switching source electrode.

The power voltage line PL may be connected to the upper electrode CE2 of the capacitor Cst via a contact hole 1158 defined in the interlayer insulating layer 115. Accordingly, the horizontal voltage line HL may have a same voltage level (a constant voltage) as a voltage level of the power voltage line PL. In addition, the power voltage line PL may be connected to the operation control source area S5 via a contact hole 1155.

The first initialization voltage line VL1 may be connected to the first initialization thin-film transistor T4 via a first initialization connection line 1173a, and the second initialization voltage line VL2 may be connected to the second initialization thin-film transistor T7 via a second initialization connection line 1173b and contact holes 1151 and 1152. In an embodiment, the first initialization voltage line VL1 and the second initialization voltage line VL2 may have a same constant voltage (e.g., −2 V or the like) as each other.

One end of the node connection line 1174 may be connected to the compensation source area S3 via a contact hole 1156, and the other end may be connected to the driving gate electrode G1 of the driving thin-film transistor T1 via a contact hole 1157.

The connection metal 1175 may be connected to the semiconductor layer of the emission control thin-film transistor T6 via a contact hole 1153 through the interlayer insulating layer 115, the second gate insulating layer 113 and the first gate insulating layer 112.

A first planarization layer 116 may be disposed on the data line DL, the power voltage line PL, the first and second initialization connection lines 1173a and 1173b, the node connection line 1174, and the connection metal 1175. The first planarization layer 116 may include an approximately flat upper surface. The first planarization layer 116 may include an organic material. In an embodiment, for example, the first planarization layer 116 may include a general-purpose polymer, such as benzocyclobutene (BCB), polyimide, hexamethyldisiloxane (HMDSO), polymethylmethacrylate (PXMMA), or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any blends thereof. In an alternative embodiment, the first planarization layer 116 may include an inorganic material. In such an embodiment, the first planarization layer 116 may include $SiO_2$, $SiN_x$, $SiO_xN_y$, $Al_2O_3$, $TiO_2$, $Ta_2O_5$, $HfO_2$, or ZnO or $ZnO_2$. In an embodiment where the first planarization layer 116 includes the inorganic material, a chemical planarization polishing may be selectively performed. Alternatively, the first planarization layer 116 may include both of an organic material and an inorganic material.

A connection line 1181 may be disposed on the first planarization layer 116. Elements that are disposed on the first planarization layer 116 may be collectively referred to as a second source drain layer. The connection line 1181 may include a conductive material, including Mo, Al, Cu, or Ti, and may have a multi-layer or single-layer structure including the material. In an embodiment, for example, the connection line 1181 may have a multi-layer structure of a Ti layer, an Al layer, and another Ti layer. The connection line 1181 may be connected to the connection metal 1175 via a contact hole 1163 through the first planarization layer 116, to be thereby electrically connected to the emission control thin-film transistor T6. For reference, in the plan view in FIG. 5, for convenience, only the conductive layers located under the first planarization layer 116 and the semiconductor layer 1130 are shown, and the connection line 1181 or the like located over the first planarization layer 116 is not shown.

A second planarization layer 117 may be disposed on the connection line 1181. The second planarization layer 117 may include an approximately flat upper surface. The second planarization layer 117 may include an organic material. In an embodiment, for example, the second planarization layer 117 may include a general-purpose polymer, such as BCB, polyimide, HMDSO, PXMMA, or PS, a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any blends thereof. In an alternative embodiment, the second planarization layer 117 may include an inorganic material. In such an embodiment, the second planarization layer 117 may include $SiO_2$, $SiN_x$, $SiO_xN_y$, $Al_2O_3$, $TiO_2$, $Ta_2O_5$, $HfO_2$, or ZnO or $ZnO_2$. In an embodiment where the second planarization layer 117 includes the inorganic material, the chemical planarization polishing may be selectively performed. In addition, the second planarization layer 117 may include both of an organic material and an inorganic material.

As described above, FIG. 4 illustrates a single pixel circuit PC, and FIG. 5 schematically illustrates an embodiment of a pixel circuit PC arranged in the central area CA of the display panel 10 included in the display apparatus 1. Such pixel circuits PC may be arranged in the first direction (the x direction or −x direction) and the second direction (the y direction or −y direction) in the central area CA. In this case, the first initialization voltage line VL1, the previous scan line SL−1, the second initialization voltage line VL2, and the next scan line SL+1 may be shared by two pixel circuits PC arranged adjacent to each other in the second direction.

In such an embodiment, the first initialization voltage line VL1 and the previous scan line SL−1 may be electrically connected to a second initialization thin-film transistor of another pixel circuit PC arranged in an upward direction (+y direction) of the pixel circuit PC shown in FIG. 5. Accordingly, a previous scan signal applied to the previous scan line SL−1 may be transferred as a next scan signal to the second initialization thin film transistor of the other pixel circuit PC. Similarly, the second initialization voltage line VL2 and the next scan line SL+1 may be electrically connected to a first initialization thin-film transistor of another pixel circuit PC arranged adjacent in a downward direction (−y direction) of the pixel circuit PC shown in FIG. 5, and transfer the previous scan signal and the initialization voltage. In this sense, the previous scan line SL−1 and the next scan line SL+1 may be defined by a same line. In addition, the first initialization voltage line VL1 and the second initialization voltage line VL2 may be a same initialization voltage line VL (see FIG. 4).

The organic light-emitting diode as the display element DPE may include a pixel electrode 210, a common electrode 230, and an intermediate layer 220 located therebetween, the intermediate layer 220 including an emission layer.

As shown in FIG. 6, the pixel electrode 210 may be disposed on the second planarization layer 117 having a flat upper surface. The pixel electrode 210 may be connected to the connection line 1181 via a contact hole defined in the second planarization layer 117 and be electrically connected to the emission control drain area D6. In addition, in the central area CA, the organic light-emitting diode as the display element DPE may overlap the pixel circuit PC electrically connected thereto, as shown in FIG. 6.

The pixel electrode 210 may be a (semi-)transmissive electrode or a reflective electrode. In some embodiments, the pixel electrode 210 may include a reflective layer and a transparent or semi-transparent electrode layer disposed thereon, where the reflective layer includes Ag, Mg, Al, Pt, Pd, Au, Ni, Nd, Ir, Cr, or any compounds thereof. The transparent or semi-transparent electrode layer may include at least one selected from indium tin oxide (ITO), indium zinc oxide (IZO), ZnO or $ZnO_2$, indium oxide ($In_2O_3$), indium gallium oxide (IGO), and aluminum zinc oxide (AZO). In some embodiments, the pixel electrode 210 may have a stacked structure of an ITO layer, an Ag layer, and another ITO layer.

A pixel-defining layer 119 may be disposed on the second planarization layer 117, and an opening that exposes a central portion of the pixel electrode 210 may be defined through the pixel-defining layer 119, thereby defining an emission area of a pixel. In addition, the pixel-defining layer 119 may prevent an arc or the like from occurring at an edge of the pixel electrode 210 by increasing a distance between the edge of the pixel electrode 210 and the common electrode 230 over the pixel electrode 210. The pixel-defining layer 119, which includes an organic insulating material, such as polyimide, polyamide, acrylic resin, BCB, HMDSO, and phenolic resin, may be formed by a method, such as spin coating.

The intermediate layer 220 may include an organic emission layer. The organic emission layer may include an organic material that includes a fluorescent or phosphorescent material emitting red, green, blue, or white light. The organic emission layer may include a low-molecular weight organic material or polymer organic material. Functional layers, such as a hole transport layer (HTL), a hole injection layer (HIL), an electron transport layer (ETL), and an electron injection layer (EIL), may optionally be further arranged under and over the organic emission layer. The intermediate layer 220 may be arranged to correspond to each of a plurality of pixel electrodes 210. However, the disclosure is not limited thereto, and layers such as the HTL, HIL, ETL, and EIL among the layers included in the intermediate layer 220 may be integrally formed as a single unitary and indivisible body across the plurality of pixel electrodes 210.

The common electrode 230 may be a transmissive electrode or a reflective electrode. In some embodiments, the common electrode 230 may be a transparent or semi-transparent electrode and may include a metal thin film having a small work function, in which Li, Ca, lithium fluoride (LiF), Al, Ag, Mg, or any compounds thereof are included. In addition to the metal thin film, a transparent conductive oxide (TCO) layer, such as an ITO layer, IZO layer, ZnO layer, $ZnO_2$ layer, or $In_2O_3$ layer, may be further included in the common electrode 230. The common electrode 230 described above may be integrally formed as a single unitary and indivisible body to correspond to the plurality of pixel electrodes 210.

An encapsulation layer 300 may be disposed on the common electrode 230, where the encapsulation layer 300 includes a first inorganic encapsulation layer 310, a second inorganic encapsulation layer 320, and an organic encapsulation layer 330 therebetween.

In this case, each of the first inorganic encapsulation layer 310 and the second inorganic encapsulation layer 320 may include $SiO_2$, $SiN_x$, $SiO_xN_y$, $Al_2O_3$, $TiO_2$, $Ta_2O_5$, $HfO_2$, or ZnO or $ZnO_2$. The organic encapsulation layer 330 may include polyethylene terephthalate, polyethylene naphthalate, polycarbonate, polyimide, polyethylene sulfonate, polyoxymethylene, polyarylate, HMDSO, acrylic resin (e.g., PXMMA, poly acrylic acid, etc.), or any combinations thereof.

Figure 7:
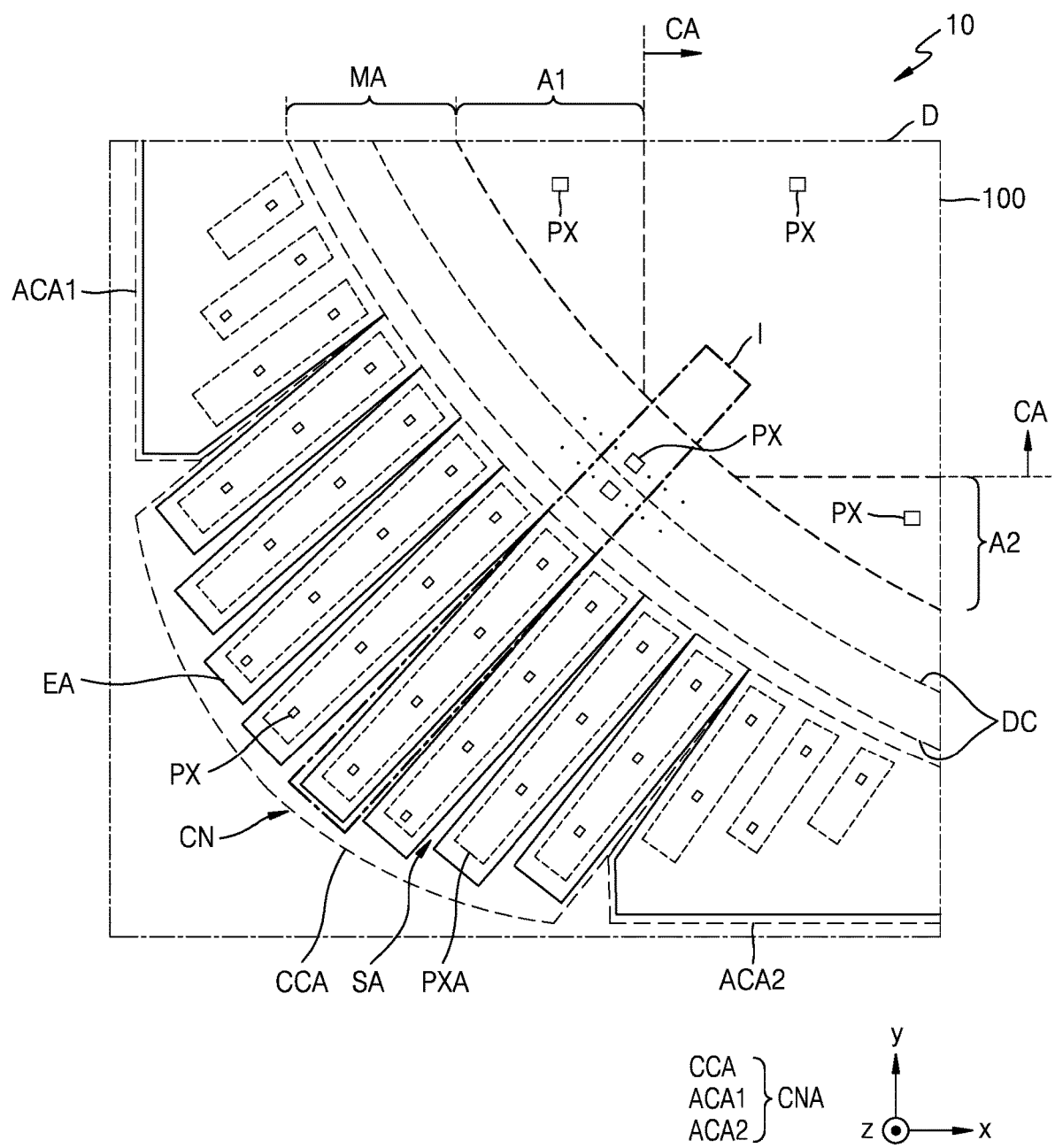
FIG. 7 is an enlarged conceptual diagram of the encircled region D in FIG. 3.
Figure 8:
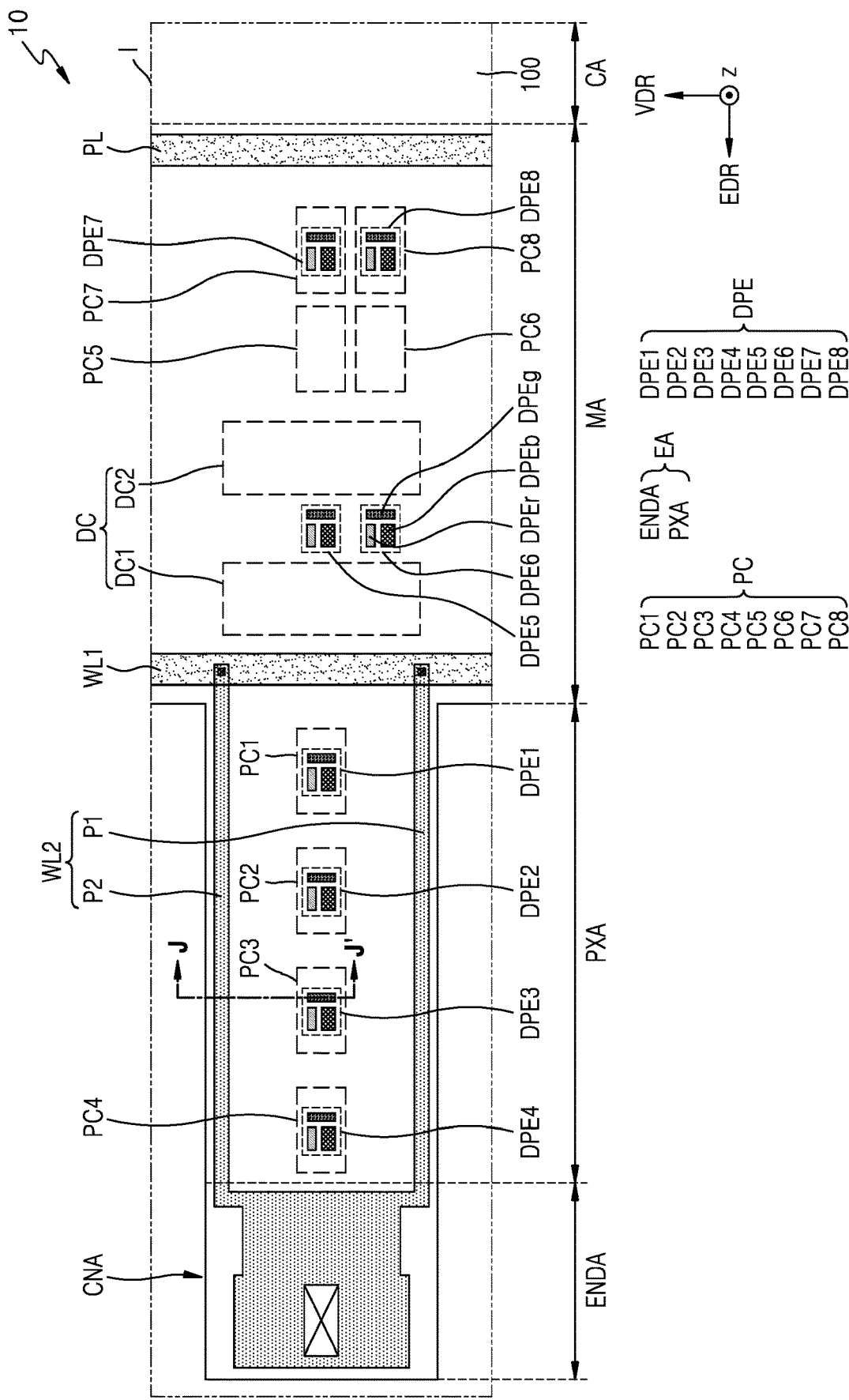
FIG. 8 is an enlarged conceptual diagram of the encircled region I in FIG. 7.

FIG. 7 is an enlarged conceptual diagram illustrating of the encircled region D in FIG. 3, and FIG. 8 is an enlarged conceptual diagram of the encircled region I in FIG. 7.

As shown in FIGS. 7 and 8, in an embodiment, the display panel 10 included in the display apparatus 1 may include the substrate 100, the pixel circuit PC, the display element DPE, and the driving circuit DC. The substrate 100 may include the central area CA, the first area A1, the second area A2, the corner area CNA, and the intermediate area MA.

The first area A1 may be adjacent to the central area CA in the first direction (the x direction or −x direction). The first area A1 may extend in the second direction (the y direction or −y direction). The second area A2 may be adjacent to the central area CA in the second direction. The second area A2 may extend in the first direction.

The corner area CNA may be an area arranged at the corner CN. In an embodiment, the corner area CNA may be an area in which the edge of the display panel 10 in the first direction and the edge of the display panel 10 in the second direction meet each other. The corner area CNA may at least partially surround the central area CA, the first area A1, and the second area A2. Alternatively, the corner area CNA may at least partially surround the central area CA, the first area A1, the second area A2, and the intermediate area MA. The corner area CNA as described above may include a central corner area CCA, a first adjacent corner area ACA1, and a second adjacent corner area ACA2.

The central corner area CCA may include an extension area EA. The extension area EA may extend in a direction away from the central area CA. The display panel 10 may include a plurality of extension areas EA. Each of the plurality of extension areas EA may extend in the direction away from the central area CA. In an embodiment, for example, each of the plurality of extension areas EA may extend in a direction crossing the first direction (the x direction or −x direction) and the second direction (the y direction or −y direction).

A separation area SA may be defined between extension areas EA adjacent to each other. The separation area SA may be an area in which elements of the display panel 10 are not arranged. When the central corner area CCA is bent at the corner CN, a greater compressive strain than a tensile strain may occur in the central corner area CCA. In an embodiment of the display apparatus 1, the separation area SA is defined between the extension areas EA adjacent to each other, and thus, the display panel 10 may be bent without being damaged in the central corner area CCA.

The first adjacent corner area ACA1 may be adjacent to the central corner area CCA. The first adjacent corner area ACA1 and at least part of the first area A1 may be located in the first direction (the x direction or −x direction). An end of the first adjacent corner area ACA1 in a direction to the central corner area CCA and an end of the central corner area CCA in a direction to the first adjacent corner area ACA1 may be apart from each other. The first adjacent corner area ACA1 may be shown to be bent on the cross-section in the first direction (the zx cross-section) and not to be bent on the cross-section in the second direction (the yz cross-section). The separation area SA may not be defined in the first adjacent corner area ACA1 described above.

The second adjacent corner area ACA2 may also be adjacent to the central corner area CCA. The second adjacent corner area ACA2 and at least part of the second area A2 may be located in the second direction (the y direction or −y direction). An end of the second adjacent corner area ACA2 in a direction to the central corner area CCA and an end of the central corner area CCA in a direction to the second adjacent corner area ACA2 may be apart from each other. The second adjacent corner area ACA2 may be shown not to be bent on the cross-section in the first direction (the zx cross-section) and may be shown to be bent on the cross-section in the second direction (the yz cross-section). The separation area SA may not be defined in the second adjacent corner area ACA2 described above.

The intermediate area MA may be located between the central area CA and the corner area CNA. The intermediate area MA may extend between the central area CA and the first adjacent corner area ACA1. In addition, the intermediate area MA may extend between the central area CA and the second adjacent corner area ACA2. The intermediate area MA may at least partially surround the central area CA, the first area A1, and the second area A2.

As shown in FIG. 7, a plurality of pixels PX may be arranged in the central area CA, the first area A1, the second area A2, the corner area CNA, and the intermediate area MA. Accordingly, the display panel 10 may be configured to display an image in the central area CA, the first area A1, the second area A2, the corner area CNA, and the intermediate area MA. Each of the pixels PX may include the display element DPE.

As shown in FIG. 8, each of the plurality of extension areas EA may include a pixel area PXA and an end area ENDA, and the display element DPE included in the pixel PX within the central corner area CCA may be arranged in the pixel area PXA. In each of the plurality of extension areas EA, the display elements DPE may be arranged in an extension direction EDR of the extension area EA.

As shown in FIG. 8, the power voltage line PL may be arranged in the intermediate area MA. The power voltage line PL may extend in a vertical direction VDR crossing the extension direction EDR of the extension area EA. The power voltage line PL may extend to surround at least part of the central area CA, the first area A1, and the second area A2. The power voltage line PL may be a driving power line configured to transfer the driving voltage ELVDD (see FIG. 4). In such an embodiment, the power voltage line PL may be configured to transfer the driving voltage ELVDD to be applied to driving transistors included in pixel circuits included in the display panel 10. The power voltage line PL as described above may be located to be biased toward the central area CA, the first area A1, and the second area A2 within the intermediate area MA.

The power voltage line PL located in the intermediate area MA may be an element of the first source drain layer described above. In an embodiment, the power voltage line PL may be disposed on the interlayer insulating layer 115 (see FIG. 6). Accordingly, the power voltage line PL may be simultaneously formed of a same material as the data line DL, the power voltage line PL, the first and second initialization connection lines 1173a and 1173b, the node connection line 1174, and the connection metal 1175 (see FIG. 5) that are located in the central area CA, and the power voltage line PL located in the intermediate area MA may have a same layered structure as a layered structure of the data line DL, the power voltage line PL, the first and second initialization connection lines 1173a and 1173b, the node connection line 1174, and the connection metal 1175 that are located in the central area CA.

As shown in FIG. 8, a first line WL1 may be arranged in the intermediate area MA. The first line WL1 may extend in the extension direction of the intermediate area MA. In an embodiment, for example, the first line WL1 may be arranged adjacent to the corner area CNA and extend along an edge of the intermediate area MA. The first line WL1 may be a power line configured to supply the common voltage ELVSS (see FIG. 4) to the common electrode of the organic light-emitting diode.

A second line WL2 located in the extension area EA may be electrically connected to the first line WL1. The second line WL2 and the first line WL1 may be disposed on layers that are different from each other. In an embodiment, for example, the second line WL2 may be disposed on the first planarization layer 116 (see FIG. 6) covering the first line WL1 disposed on the interlayer insulating layer 115. In such an embodiment, the first line WL1 may be simultaneously formed of a same material as the power voltage line PL located in the intermediate area MA, and the data line DL, the power voltage line PL, the node connection line 1174, and the connection metal 1175 that are located in the central area CA. The second line WL2 may be simultaneously formed of a same material as the connection line 1181 (see FIG. 6) or the like. In an embodiment, the second line WL2 may be an element of the second source drain layer. In such an embodiment, the second line WL2 and the first line WL1 may be electrically connected to each other via a contact hole of the first planarization layer 116. Accordingly, the second line WL2 may also be a power line configured to supply the common voltage ELVSS (see FIG. 4).

The second line WL2 may include a first portion P1 and a second portion P2. Each of the first portion P1 and the second portion P2 may extend into the extension area EA from the intermediate area MA. The first portion P1 and the second portion P2 may be apart from each other in the intermediate area MA. Each of the first portion P1 and the second portion P2 may be adjacent to an edge of the extension area EA. In an embodiment, for example, the first portion P1 may be adjacent to edge on one side of the extension area EA, and the second portion P2 may be adjacent to an edge on the other side of the extension area EA. The edge on the one side of the extension area EA and the edge on the other side may define different separation areas SA from each other.

The first portion P1 and the second portion P2 may meet each other in the end area ENDA of the extension area EA. In an embodiment, the first portion P1 and the second portion P2 may be integrally formed as a single unitary and indivisible body. Accordingly, the second line WL2 may have a shape with an opening in one side. In such an embodiment, the second line WL2 may have the shape having the opening in a direction to the central area CA. In such an embodiment where the first portion P1 and the second portion P2 meet each other in the end area ENDA, the second line WL2 may maintain a low resistance.

The pixel circuits PC may be arranged in the extension area EA and the intermediate area MA. The pixel circuit PC arranged in the extension area EA and the intermediate area MA may be a same as or similar to the pixel circuit PC arranged in the central area CA, which is described with reference to FIG. 5. Power voltage lines of the pixel circuits PC arranged in the extension area EA and the intermediate area MA may be electrically connected to the power voltage line PL arranged in the intermediate area MA via a connection line (not shown).

Referring again to FIG. 7, the driving circuit DC may be arranged in the intermediate area MA. The driving circuit DC may be a scan driving circuit configured to provide a scan signal to pixel circuits via the scan line SL, where the pixel circuits are electrically connected to sub-pixels included in the pixel PX arranged in the central area CA, the intermediate area MA, the extension area EA, etc. Alternatively, the driving circuit DC may be an emission control driving circuit configured to provide an emission control signal via an emission control line (not shown) to pixel circuits electrically connected to the sub-pixels. The driving circuit DC may be arranged in the extension direction of the intermediate area MA. The driving circuit DC may be arranged to at least partially surround the central area CA, the first area A1, and the second area A2. The driving circuit DC may supply a scan signal via a scan line and supply a previous scan signal via a previous scan line. Alternatively, the driving circuit DC may supply an emission control signal via the emission control line.

The driving circuit DC may include a first driving circuit DC1 and a second driving circuit DC2, as shown in FIG. 8. In an embodiment, one of the first driving circuit DC1 and the second driving circuit DC2 may supply a scan signal or previous scan signal via the scan line or a previous scan line. The other one of the first driving circuit DC1 and the second driving circuit DC2 may supply an emission control signal via the emission control line. For reference, in FIG. 8, only part of the driving circuit DC arranged in the extension direction of the intermediate area MA is schematically shown.

Pixel circuits PC5, PC6, PC7, and PC8 may be located in the intermediate area MA such that the pixel circuits PC5, PC6, PC7, and PC8 are between the driving circuit DC and the power voltage line PL. Display elements DPE7 and DPE8 electrically connected to the pixel circuits PC7 and PC8 may be located over the pixel circuits PC7 and PC8 respectively. In an embodiment, the display elements DPE5 and DPE6 electrically connected to the pixel circuits PC5 and PC6 respectively may not be located over the pixel circuits PC5 and PC6. The display elements DPE5 and DPE6 may be located over the driving circuit DC to overlap the driving circuit DC. In such an embodiment, the display elements DPE5 and DPE6 may be located farther away from the power voltage line PL than the pixel circuits PC5 and PC6.

In FIG. 8, for convenience of explanation, the display elements DPE5 and DPE6 are located between the first driving circuit DC1 and the second driving circuit DC2. However, the disclosure is not limited thereto. In an alternative embodiment, for example, the display elements DPE5 and DPE6 may overlap the first driving circuit DC1 or the second driving circuit DC2. The display elements DPE5 and DPE6 may be electrically connected to the pixel circuits PC5 and PC6 via pixel connection lines (not shown) disposed on the first planarization layer 116. The pixel connection lines may be elements of the second source drain layer. In an embodiment, the pixel connection lines may be disposed on the first planarization layer 116. Accordingly, the pixel connection lines may be simultaneously formed of a same material as the connection line 1181 located in the central area CA, and the pixel connection lines may have a same layered structure as a layered structure of the connection line 1181.

In an embodiment of the display apparatus 1, by having the configuration described above, an image may be displayed even in a place where the driving circuit DC is present, and thus, an area of the display panel 10 in which an image is displayed may be substantially increased.

In an embodiment, each of the display elements DPE5, DPE6, DPE7, and DPE8 located in the intermediate area MA may include a red display element DPEr, a green display element DPEg, and a blue display element DPEb, and in this case, each of the pixel circuits PC5, PC6, PC7, and PC8 may include a pixel circuit electrically connected to the red display element DPEr, a pixel circuit electrically connected to the green display element DPEg, and a pixel circuit electrically connected to the blue display element DPEb.

For reference, in FIG. 8, only four pixel circuits PC5, PC6, PC7, and PC8 in the intermediate area MA are shown, for convenience. However, the disclosure is not limited thereto.

In an embodiment, as shown in FIG. 8, the pixel circuits PC1, PC2, PC3, and PC4 may be located in the extension area EA, and the display elements DPE1, DPE2, DPE3, and DPE4 may be located over the pixel circuits PC1, PC2, PC3, and PC4. The display elements DPE1, DPE2, DPE3, and DPE4 may be electrically connected to the pixel circuits PC1, PC2, PC3, and PC4. However, a number of pixel circuits located in the extension area EA and a number of display elements may be modified. In addition, each of the display elements DPE1, DPE2, DPE3, and DPE4 may include a red display element DPEr, a green display element DPEg, and a blue display element DPEb, and in this case, each of the pixel circuits PC1, PC2, PC3, and PC4 may also include a pixel circuit electrically connected to the red display element DPEr, a pixel circuit electrically connected to the green display element DPEg, and a pixel circuit electrically connected to the blue display element DPEb. In addition, a common electrode of the display elements DPE1, DPE2, DPE3, and DPE4 located in the extension area EA may be electrically connected to the second line WL2 and receive the common voltage ELVSS.

Figure 9:
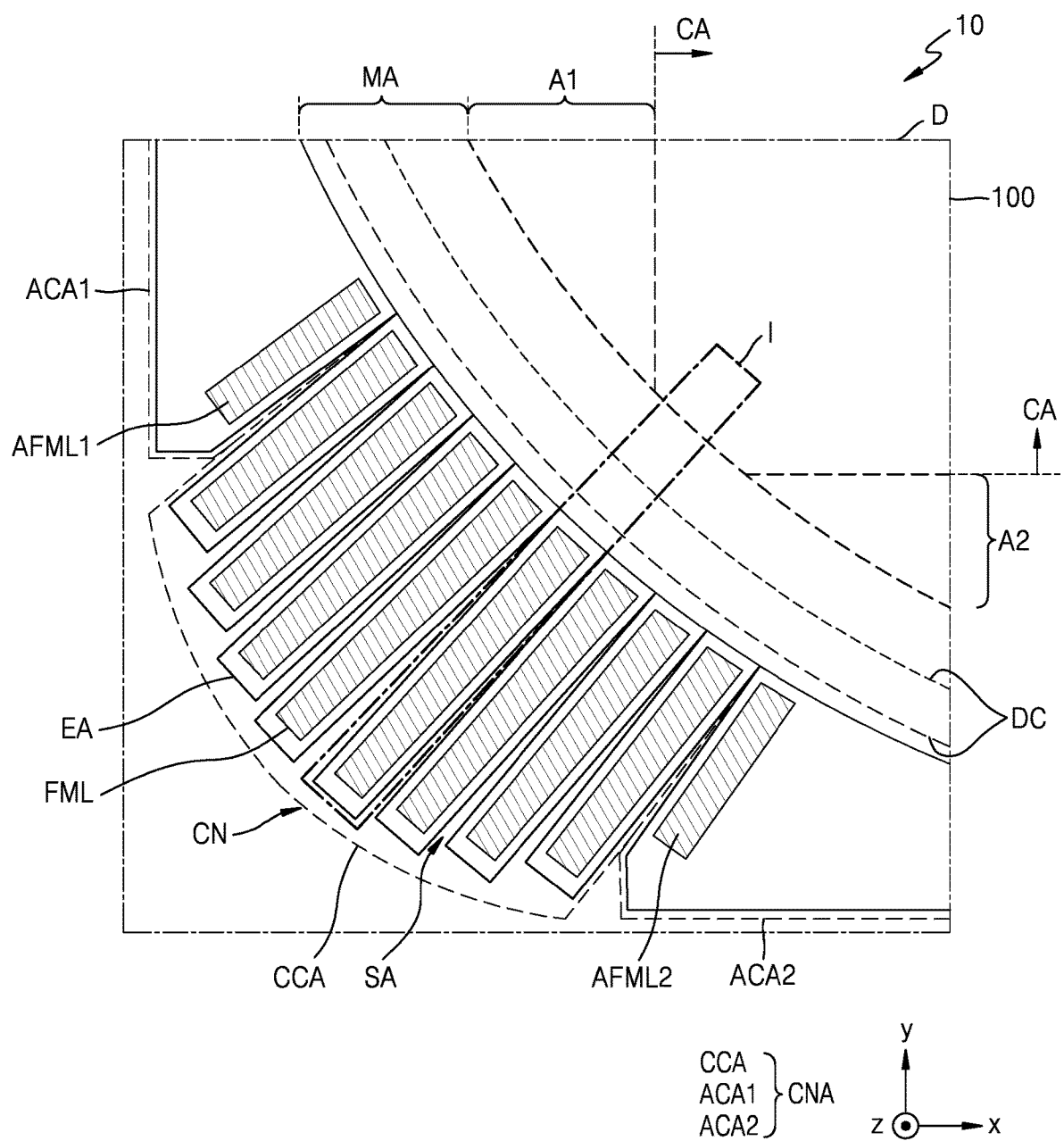
FIG. 9 is a conceptual diagram schematically illustrating a portion of FIG. 7.

FIG. 9 is a conceptual diagram schematically illustrating a portion of FIG. 7. In an embodiment, as shown in FIG. 9, ferromagnetic layers FML may be arranged in the plurality of extension areas EA. The ferromagnetic layers FML may have a shape extending in the direction away from the central area CA. In such an embodiment, each of the ferromagnetic layers FML may have a similar shape to a shape of a corresponding extension area EA. The ferromagnetic layers FML may include iron (Fe), Ni, or cobalt (Co). Each of the ferromagnetic layers FML may be arranged in a corresponding one of the extension areas EA. In an embodiment, for example, the ferromagnetic layers FML and the extension areas EA may correspond to each other in a one-to-one manner, as shown in FIG. 9. In an embodiment, a single ferromagnetic layer FML may be located in each extension area EA.

Figure 10:
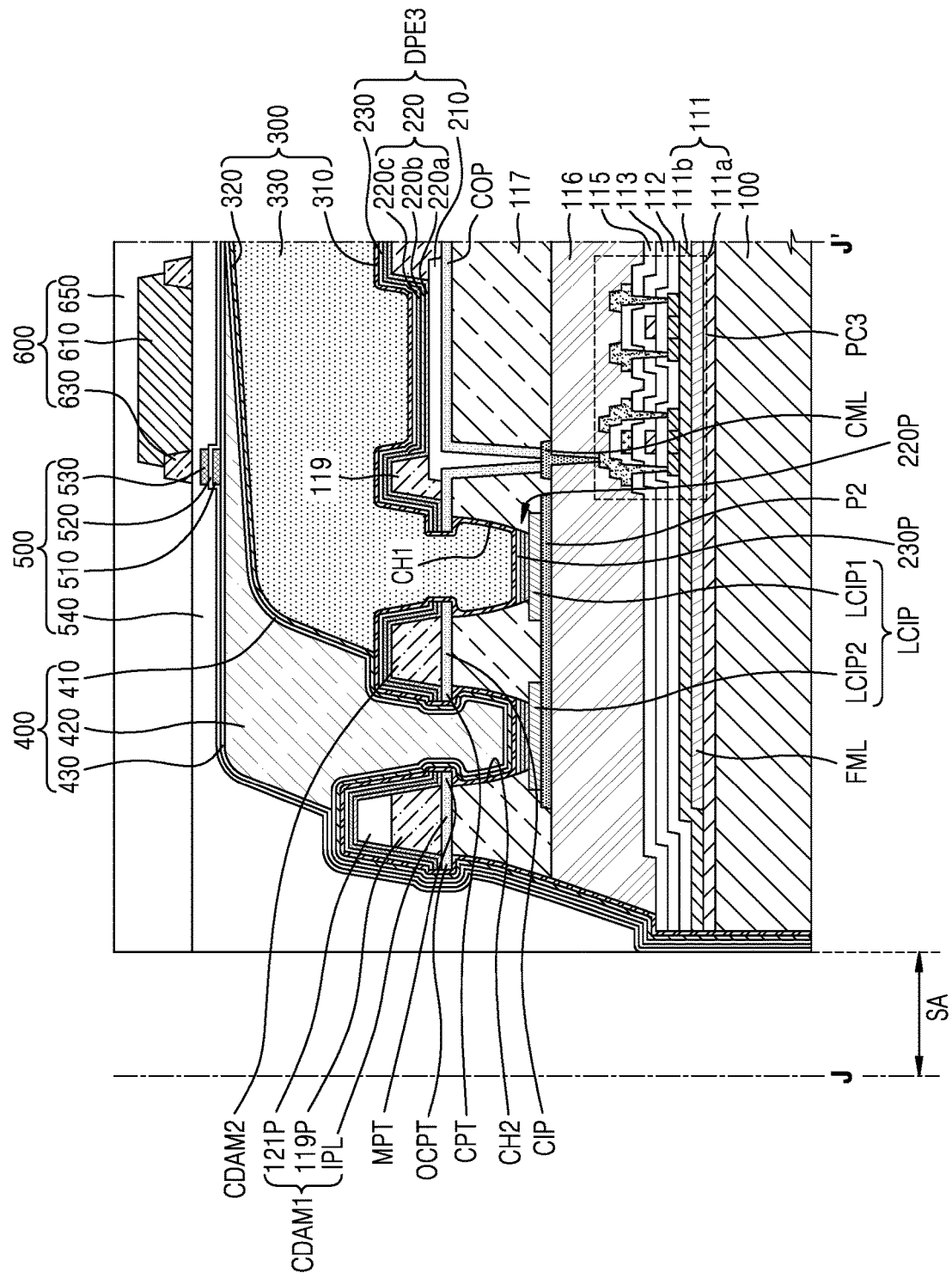
FIG. 10 is a cross-sectional view schematically illustrating a cross-section of the display apparatus, taken along line J-J' in FIG. 8.

FIG. 10 is a cross-sectional view schematically illustrating a cross-section of the display apparatus 1, taken along line J-J' in FIG. 8. A structure of a portion of the extension area EA around the separation area SA will hereinafter be described with reference to FIG. 10. In FIG. 10, the same reference numerals as those indicated in FIG. 6 denote same or corresponding members, and any repetitive detailed descriptions thereof will be omitted for convenience. For reference, in FIG. 10, the pixel circuit PC3 is shown as an example, and the pixel circuit PC3 may have a structure different from the structure shown in FIG. 10.

In an embodiment, as shown in FIG. 10, the ferromagnetic layer FML may be located between the first buffer layer 111*a* and the second buffer layer 111*b*. Alternatively, the ferromagnetic layer FML may be disposed on another layer. In an embodiment, where a plurality of insulating layers are disposed on the substrate 100 in the extension area EA, the ferromagnetic layer FML may be disposed between two adjacent insulating layers among the insulating layers.

A connection electrode CML may be disposed on the first planarization layer 116 covering the interlayer insulating layer 115, such that the connection electrode CML may be disposed in a same layer in which the connection line 1181 described above with reference to FIG. 6 is disposed, that is, the connection electrode CML may be disposed directly on a same layer on which the connection line 1181 described above with reference to FIG. 6 is disposed directly, and may be simultaneously formed of a same material as the connection line 1181. The connection electrode CML may serve to electrically connect the pixel circuit PC3 located thereunder to the pixel electrode 210 located thereover.

The second portion P2 included in the second line WL2 may be disposed on the first planarization layer 116, similar to the connection electrode CML, and may be simultaneously formed of a same material as the connection electrode CML, where the second line WL2 is a power line electrically connected to the common electrode 230 included in the organic light-emitting diode that is the display element DPE3 and is configured to supply the common voltage ELVSS (see FIG. 4) to the common electrode 230.

The second planarization layer 117 may cover the second portion P2, i.e., the second line WL2 and the connection electrode CML, and a first corner hole CH1 and a second corner hole CH2 may be defined through the second planarization layer 117, as shown in FIG. 10. In an embodiment, a contact hole may be further defined through the second planarization layer 117 such that the pixel electrode 210 disposed on the second planarization layer 117 is connected to the connection electrode CML via the contact hole. The first corner hole CH1, the second corner hole CH2, and the contact hole may be simultaneously formed with each other.

The first corner hole CH1 and the second corner hole CH2 may overlap the second portion P2 of the second line WL2, and a lower corner inorganic pattern LCIP disposed on the second portion P2 of the second line WL2 may prevent or minimize damage to the second portion P2 of the second line WL2 in a process of forming the first corner hole CH1 and the second corner hole CH2. In an embodiment, for example, the lower corner inorganic pattern LCIP may include a first lower corner inorganic pattern LCIP1 and a second lower corner inorganic pattern LCIP2, and in such an embodiment, the first lower corner inorganic pattern LCIP1 may overlap the first corner hole CH1, and the second lower corner inorganic pattern LCIP2 may overlap the second corner hole CH2. Accordingly, the second line WL2 may not be exposed in the process of forming the first corner hole CH1 and the second corner hole CH2, or an exposed area thereof may be reduced, so that damage to the second line WL2 may be prevented or reduced. The lower corner inorganic pattern LCIP described above may include $SiO_2$, $SiN_x$, $SiO_xN_y$, $Al_2O_3$, $TiO_2$, $Ta_2O_5$, $HfO_2$, or ZnO or $ZnO_2$.

An overlapping inorganic pattern COP, a corner inorganic pattern CIP, and an inorganic pattern line IPL may be disposed on the second planarization layer 117. The overlapping inorganic pattern COP, the corner inorganic pattern CIP, and the inorganic pattern line IPL may be simultaneously formed of a same material. Each of the overlapping inorganic pattern COP, the corner inorganic pattern CIP, and the inorganic pattern line IPL may include $SiO_2$, $SiN_x$, $SiO_xN_y$, $Al_2O_3$, $TiO_2$, $Ta_2O_5$, $HfO_2$, or ZnO or $ZnO_2$.

The overlapping inorganic pattern COP may be disposed on the second planarization layer 117 and may be located around the contact hole. In addition, the overlapping inorganic pattern COP may also be disposed on an inner side surface of the contact hole, as shown in FIG. 10. In an embodiment, the pixel electrode 210 disposed on the second planarization layer 117 may be disposed on the overlapping inorganic pattern COP and connected to the connection electrode CML via the contact hole.

The corner inorganic pattern CIP may be apart from the overlapping inorganic pattern COP by the first corner hole CH1, but may have a shape that at least partially surrounds the overlapping inorganic pattern COP in a plan view. The inorganic pattern line IPL may be apart from the corner inorganic pattern CIP by the second corner hole CH2, but may have a shape that at least partially surrounds the corner inorganic pattern CIP in a plan view.

The corner inorganic pattern CIP may include a corner protruding tip CPT in a direction to a center of at least one of the first corner hole CH1 and the second corner hole CH2. In an embodiment, as shown in FIG. 10, the corner inorganic pattern CIP may protrude in both directions to centers of the first corner hole CH1 and the second corner hole CH2. The inorganic pattern line IPL may include an intermediate protruding tip MPT in the direction to the center of the second corner hole CH2. In addition, the inorganic pattern line IPL may include an outer corner protruding tip OCPT in a direction to the separation area SA. In addition, the overlapping inorganic pattern COP may also include a protruding tip in the direction to the center of the first corner hole CH1, as shown in FIG. 10.

The pixel-defining layer 119 may also cover an edge of the pixel electrode 210 in the extension area EA as in the central area CA. In an embodiment, a first pattern 119P may be formed simultaneously when the pixel-defining layer 119 is formed, and may include a same material as the pixel-defining layer 119. The first pattern 119P may be disposed on the inorganic pattern line IPL. The first pattern 119P may form a first corner dam CDAM1 together with the inorganic pattern line IPL. In an embodiment, a second pattern 121P disposed on the first pattern 119P may be formed simultaneously when a spacer (not shown) is formed on the pixel-defining layer 119, and include a same material as the pixel-defining layer 119. In such an embodiment, the first pattern 119P and the second pattern 121P may form the first corner dam CDAM1 together with the inorganic pattern line IPL. In addition, a second corner dam CDAM2 may be formed simultaneously when the pixel-defining layer 119 is formed, and include a same material as the pixel-defining layer 119, where the second corner dam CDAM2 is apart from the first corner dam CDAM1 and is disposed on the corner inorganic pattern CIP.

The intermediate layer 220 may be disposed on the pixel-defining layer 119. The intermediate layer 220 may be arranged in an opening of the pixel-defining layer 119 and include an emission layer 220b overlapping the pixel electrode 210. The intermediate layer 220 may further include at least one selected from a first functional layer 220a and a second functional layer 220c, where the first functional layer 220a is between the pixel electrode 210 and the emission layer 220b, and the second functional layer 220c is on the emission layer 220b. In an embodiment, for example, the first functional layer 220a may include an HTL or may include an HTL and an HIL. The second functional layer 220c may include an ETL and/or an EIL. The first functional layer 220a and/or the second functional layer 220c may be integrally formed as a single unitary and indivisible body to correspond to a plurality of pixel electrodes 210. In an embodiment, the intermediate layer 220 arranged in the central area CA may also be integrally formed as a single unitary and indivisible body to correspond to a plurality of pixel electrodes 210.

In an embodiment, as described above, the overlapping inorganic pattern COP may include the protruding tip in the direction to the center of the first corner hole CH1. In addition, the corner inorganic pattern CIP may include the corner protruding tip CPT in the direction to the center of the first corner hole CH1. Accordingly, when the first functional layer 220a and the second functional layer 220c are formed, a functional layer pattern 220P that is separated from the first functional layer 220a and the second functional layer 220c and is located within the first corner hole CH1 may be formed by the corner protruding tip CPT of the corner inorganic pattern CIP and located in the first corner hole CH1. In such an embodiment, as described above, the inorganic pattern line IPL may include the intermediate protruding tip MPT in the direction to the center of the second corner hole CH2. Accordingly, when the first functional layer 220a and the second functional layer 220c are formed, the functional layer pattern 220P that is located within the second corner hole CH2 may be formed by the corner protruding tip CPT and the intermediate protruding tip MPT.

The common electrode 230 may be integrally formed as a single unitary and indivisible body over the pixel-defining layer 119 and the intermediate layer 220 to correspond to the plurality of pixel electrodes 210 in the extension area EA. Accordingly, similarly to the functional layer pattern 220P located within the first corner hole CH1 and the second corner hole CH2 is formed, a common electrode pattern 230P located within the first corner hole CH1 and the second corner hole CH2 may be formed.

The first inorganic encapsulation layer 310 included in the encapsulation layer 300 may be disposed on the common electrode 230, and may be in direct contact with the protruding tip of the overlapping inorganic pattern COP, the corner protruding tip CPT of the corner inorganic pattern CIP, and the intermediate protruding tip MPT of the inorganic pattern line IPL. In an embodiment, as shown in FIG. 10, the first inorganic encapsulation layer 310 may be in contact with the common electrode pattern 230P in the first corner hole CH1 and the second corner hole CH2, and cover inner surfaces of the first corner hole CH1 and the second corner hole CH2. The organic encapsulation layer 330 included in the encapsulation layer 300 may be disposed on the first inorganic encapsulation layer 310, and fill the first corner hole CH1, as shown in FIG. 10. The second corner dam CDAM2 may prevent a material for forming the organic encapsulation layer 330 from flowing to the outside or an undesired area in a manufacturing process. The second inorganic encapsulation layer 320 included in the encapsulation layer 300 may be disposed on the organic encapsulation layer 330. The second inorganic encapsulation layer 320 may be in direct contact with the first inorganic encapsulation layer 310 on the second corner dam CDAM2. In an embodiment, the second inorganic encapsulation layer 320 may be in direct contact with the first inorganic encapsulation layer 310 even in the second corner hole CH2.

In an embodiment, the display apparatus 1 may further include a protective layer 400, a touch sensor layer 500, and an anti-reflection layer 600, as shown in FIG. 10.

The protective layer 400 may be disposed on the encapsulation layer 300. The protective layer 400 may protect the encapsulation layer 300. The protective layer 400 may include a first inorganic protective layer 410, an organic protective layer 420, and a second inorganic protective layer 430. Each of the first inorganic protective layer 410 and the second inorganic protective layer 430 may include $SiO_2$, $SiN_x$, $SiO_xN_y$, $Al_2O_3$, $TiO_2$, $Ta_2O_5$, $HfO_2$, or ZnO or $ZnO_2$. The organic protective layer 420 may include polyethylene terephthalate, polyethylene naphthalate, polycarbonate, polyimide, polyethylene sulfonate, polyoxymethylene, polyarylate, hexamethyldisiloxane, an acrylic resin (e.g., poly methyl methacrylate, poly acrylic acid, etc.), or any combinations thereof.

The first inorganic protective layer 410 may be disposed on the encapsulation layer 300, and the organic protective layer 420 may be disposed on the first inorganic protective layer 410. In addition, the second inorganic protective layer 430 may be disposed on the organic protective layer 420. The organic protective layer 420 may fill the second corner hole CH2. The second inorganic protective layer 430 may be in direct contact with the first inorganic protective layer 410 on the first corner dam CDAM1. The first inorganic protective layer 410 may surround the corner protruding tip CPT of the corner inorganic pattern CIP. In addition, the first inorganic protective layer 410 and the second inorganic protective layer 430 may surround the outer corner protruding tip OCPT of the inorganic pattern line IPL. Accordingly, damage to the display apparatus 1 due to oxygen, moisture, etc. from the outside may be effectively prevented, and by increasing a mechanical strength of the display apparatus 1, damage due to external shock may be prevented.

The touch sensor layer 500 may be disposed on the protective layer 400. The touch sensor layer 500 may include a first touch conductive layer 510, a first touch insulating layer 520, a second touch conductive layer 530, and a second touch insulating layer 540. In an embodiment, the second touch insulating layer 540 may overlap the outer corner protruding tip OCPT of the inorganic pattern line IPL.

The anti-reflection layer 600 may be disposed on the touch sensor layer 500. In an embodiment, for example, the anti-reflection layer 600 may include a color filter 610, a black matrix 630, and a planarization layer 650. The color filter 610 may overlap the pixel electrode 210.

Figure 11:
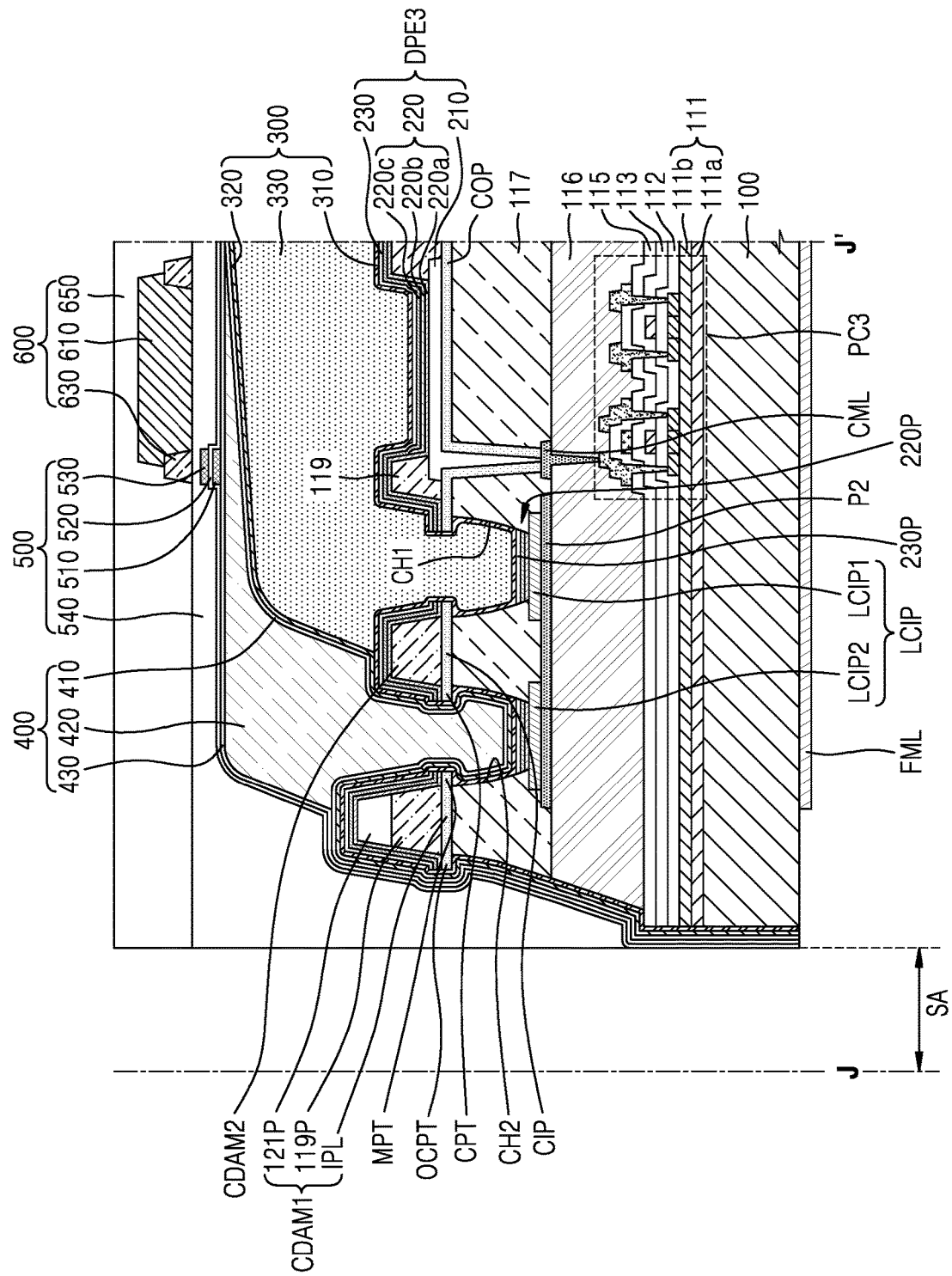
FIG. 11 is a cross-sectional view schematically illustrating a portion of a display apparatus according to an alternative embodiment.

In an embodiment, as shown in FIG. 10, the ferromagnetic layer FML is located between a plurality of insulating layers over the substrate 100 in the extension area EA. However, the disclosure is not limited thereto. In an alternative embodiment, for example, the ferromagnetic layer FML may be disposed under the substrate 100, as shown in FIG. 11, which is a cross-sectional view schematically illustrating a portion of the display apparatus 1 according to an alternative embodiment.

Figure 12:
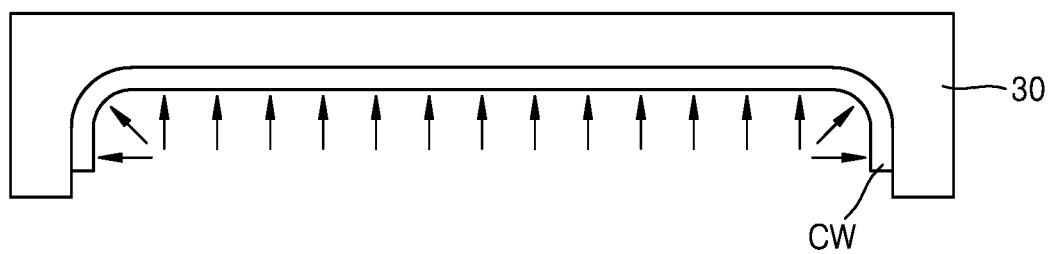
FIG. 12 is a conceptual diagram for describing a method of manufacturing a display apparatus, according to an embodiment.

FIG. 12 is a conceptual diagram for describing a method of manufacturing a display apparatus 1, according to an embodiment. As shown in FIG. 12, the cover window CW may be prepared. An operation of preparing the cover window CW may include an operation of performing deformation by using a jig 30 including a bent portion such that the cover window CW includes a curve. The jig 30 may correspond to a frame having a shape of a display apparatus 1 to be finally manufactured. The cover window CW may be deformed according to the shape within the jig 30 by closely adhering the cover window CW to the jig 30. The cover window CW may be formed of any material that is transmissive and is deformable by the jig 30. In an embodiment, for example, the cover window CW may include polymer resin, such as polyimide, polyethylene, or polyethylene terephthalate.

In an embodiment, the display panel 10 that is flat and is not in a bent state may be prepared as shown in FIG. 3. In addition, a guide film GF as shown in FIG. 13 may be prepared.

Figure 13:
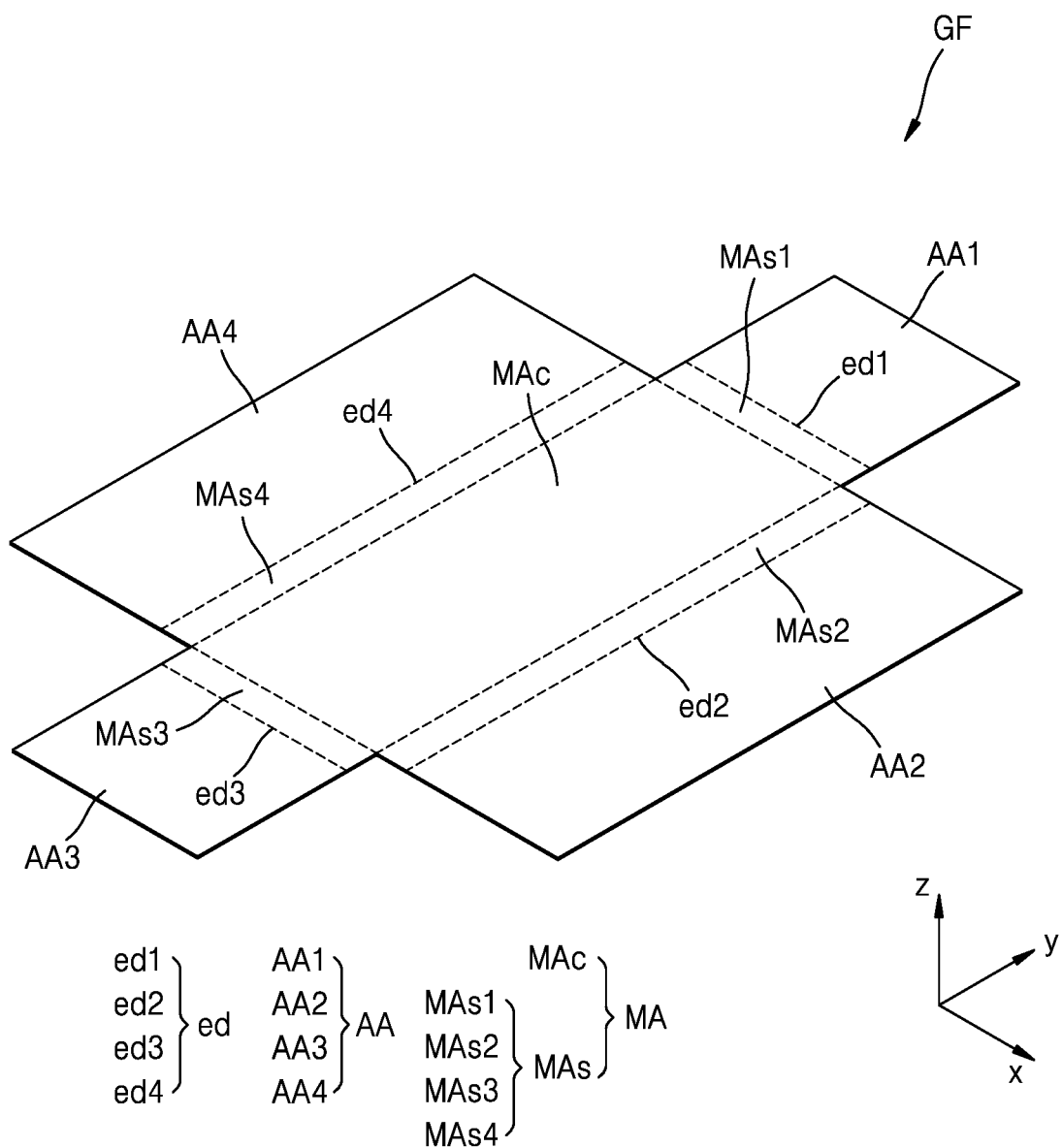
FIG. 13 is a perspective view schematically illustrating a guide film that is used in a method of manufacturing a display apparatus, according to an embodiment.

As shown in FIG. 13, the guide film GF may include a main area MA and an auxiliary area AA. The auxiliary area AA may be connected to an edge ed of the main area MA. The auxiliary area AA may be an extension of the edge ed of the main area MA.

The auxiliary area AA may include a plurality of auxiliary areas. In an embodiment, for example, the auxiliary area AA may include a first auxiliary area AA1, a second auxiliary area AA2, a third auxiliary area AA3, and a fourth auxiliary area AA4, where the first auxiliary area AA1 is connected to a first edge ed1 of the main area MA, the second auxiliary area AA2 is connected to a second edge ed2 of the main area MA, the third auxiliary area AA3 is connected to a third edge ed3 of the main area MA, and the fourth auxiliary area AA4 is connected to a fourth edge ed4 of the main area MA. In an embodiment, as shown in FIG. 13, the second edge ed2 may cross the first edge ed1, the third edge ed3 may be parallel to the first edge ed1, and the fourth edge ed4 may be parallel to the second edge ed2.

The plurality of auxiliary areas AA may be apart from each other. The first auxiliary area AA1 may be separated from each of the second auxiliary area AA2, the third auxiliary area AA3, and the fourth auxiliary area AA4. The second auxiliary area AA2 may be apart from each of the first auxiliary area AA1, the third auxiliary area AA3, and the fourth auxiliary area AA4. The third auxiliary area AA3 may be apart from each of the first auxiliary area AA1, the second auxiliary area AA2, and the fourth auxiliary area AA4. The fourth auxiliary area AA4 may be apart from each of the first auxiliary area AA1, the second auxiliary area AA2, and the third auxiliary area AA3.

The main area MA may include a central area MAc and a side area MAs.

The central area MAc may correspond to a central portion of the main area MA. The central area MAc may have a rectangular shape when viewed from a direction perpendicular to the main area MA (e.g., a z direction), as shown in FIG. 13.

The side area MAs may be located between the central area MAc and the auxiliary area AA. The side area MAs may include a plurality of side areas, and each of the plurality of side areas may be located between the central area MAc and the plurality of auxiliary areas AA. In an embodiment, for example, the side area MAs may include a first side area MAs1, a second side area MAs2, a third side area MAs3, and a fourth side area MAs4. Each of the first side area MAs1, the second side area MAs2, the third side area MAs3, and the fourth side area MAs4 may be located between the central area MAc and a corresponding one among the plurality of auxiliary areas AA. The first side area MAs1 may be located between the central area MAc and the first auxiliary area AA1, the second side area MAs2 may be located between the central area MAc and the second auxiliary area AA2, the third side area MAs3 may be located between the central area MAc and the third auxiliary area AA3, and the fourth side area MAs4 may be located between the central area MAc and the fourth auxiliary area AA4.

An embodiment of a method of manufacturing the display apparatus 1 after the display panel 10 and the guide film GF are prepared as described above will hereinafter described with reference to FIGS. 14 to 17.

Figure 14:
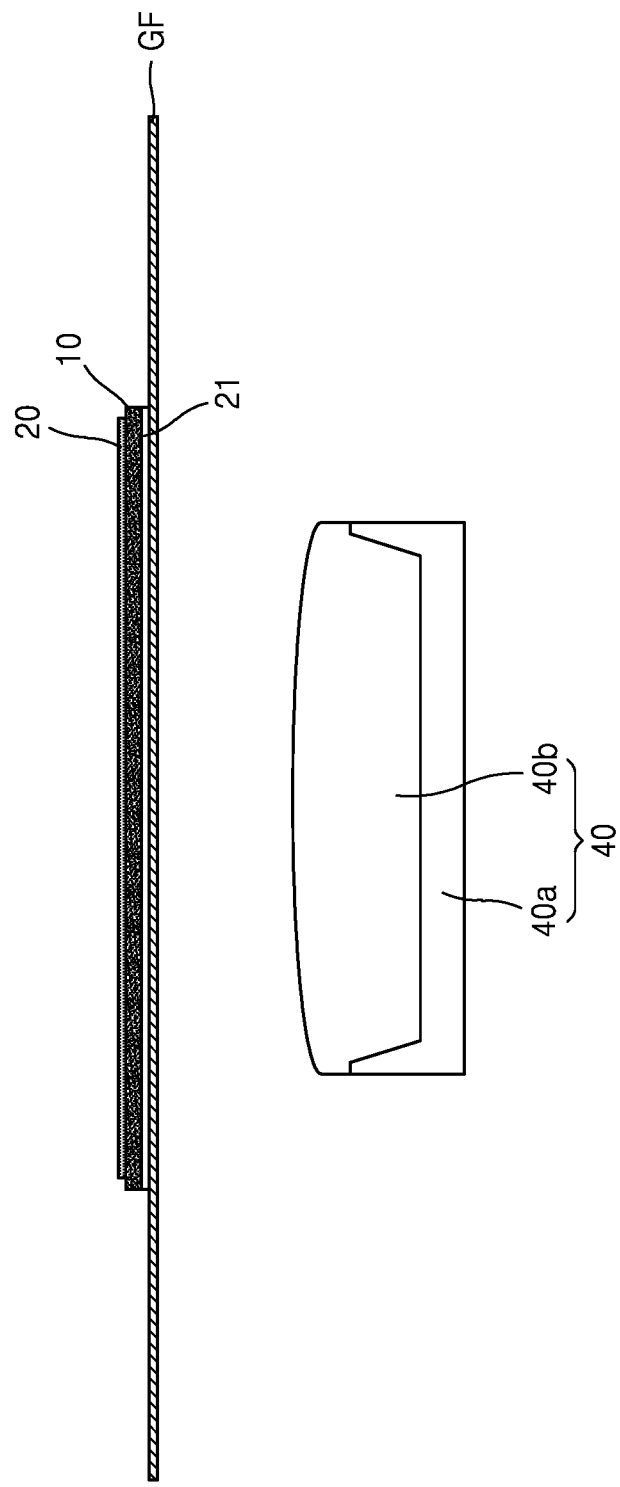
FIGS. 14 to 17 are conceptual diagrams for describing a method of manufacturing a display apparatus, according to an embodiment.

First, a first adhesive layer 20 may be attached to a front surface of the display panel 10 (e.g., as shown in FIG. 14, a surface to which the cover window CW is to be attached or in a+z direction). The first adhesive layer 20 may be a transparent adhesive member, such as an OCA film. The first adhesive layer 20 described above may include an acryl-based OCA film.

Next, the guide film GF may be attached to a rear surface of the display panel 10 to which the first adhesive layer 20 is not attached. A second adhesive layer 21 may be between the rear surface of the display panel 10 and the guide film GF, and the rear surface of the display panel 10 and the guide film GF may be attached through the second adhesive layer 21. The second adhesive layer 21 may be a transparent adhesive member, such as an OCA film. The second adhesive layer 21 may include a silicon-based OCA film.

When the guide film GF is attached to the rear surface of the display panel 10, the attachment may be performed in a way such that the rear surface of the display panel 10 corresponds to the main area MA (see FIG. 13) of the guide film GF. In an embodiment, for example, the main area MA of the guide film GF may be attached to the rear surface of the display panel 10 such that the central area CA (see FIG. 3) of the display panel 10 overlaps the central area MAc (see FIG. 13) of the guide film GF, first areas A1 (see FIG. 3) at opposite sides of the display panel 10 overlap the second side area MAs2 and the fourth side area MAs4 (see FIG. 13) of the guide film GF, and second areas A2 (see FIG. 3) at opposite sides of the display panel 10 overlap the first side area MAs1 and the third side area MAs3 (see FIG. 13) of the guide film GF. Accordingly, the guide film GF may not be attached to a portion of the corner area CNA (see FIG. 3) of the display panel 10. In an embodiment, for example, the extension areas EA (see FIG. 7) of the display panel 10 may not be attached to the guide film GF.

Figure 15:
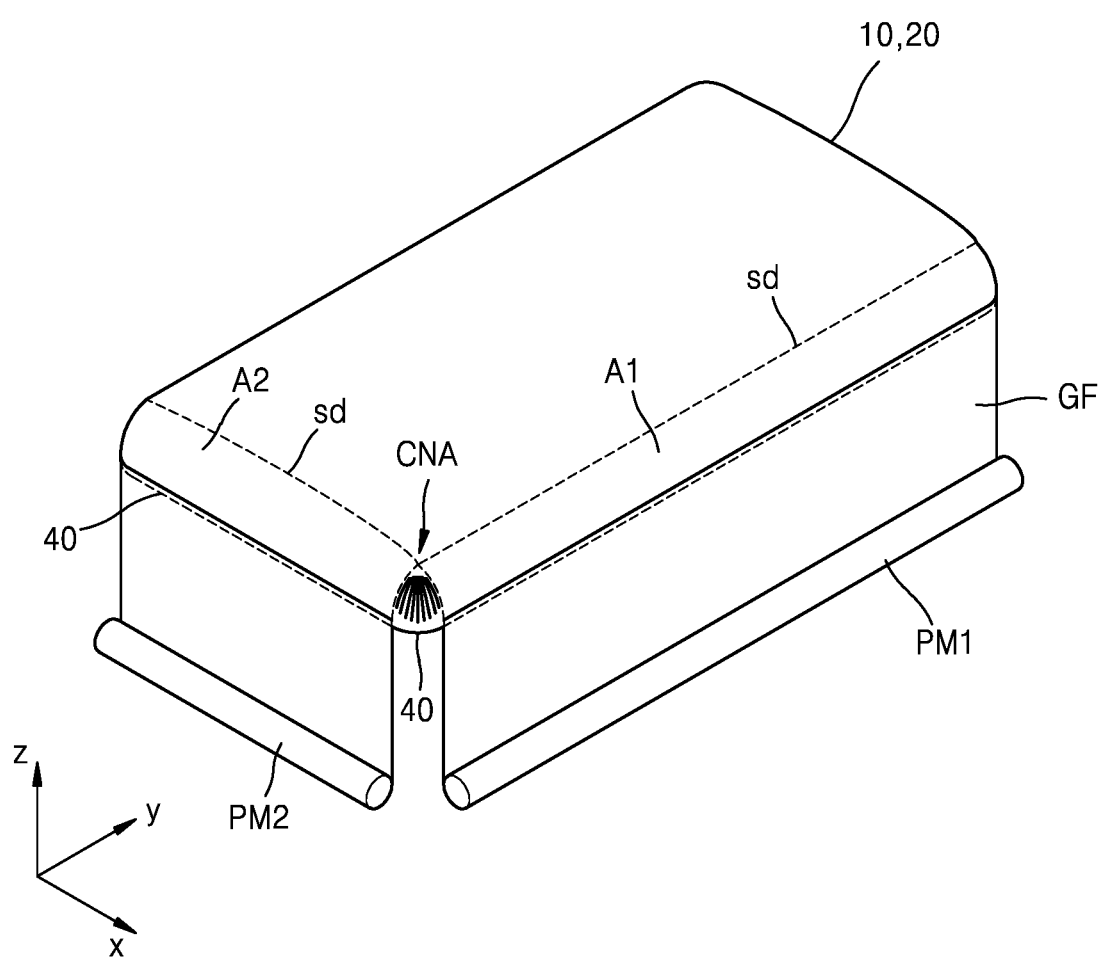

Next, the shape of the display panel 10 may be deformed by applying an external force to the guide film GF, as shown in FIGS. 14 and 15. First, the rear surface of the display panel 10 to which the guide film GF is attached may be arranged to face a pad portion 40, and then, the display panel 10 and the pad portion 40 may be aligned with each other. In addition, the guide film GF attached to the rear surface of the display panel 10 may be mounted on the pad portion 40, as shown in FIG. 15. In such an embodiment, push members PM1 and PM2 may be disposed on the guide film GF. The guide film GF may be adhered to side surfaces of the pad portion 40 by using the push members PM1 and PM2. As a result, the display panel 10 may be pre-formed into a shape matching the cover window CW.

Figure 16:
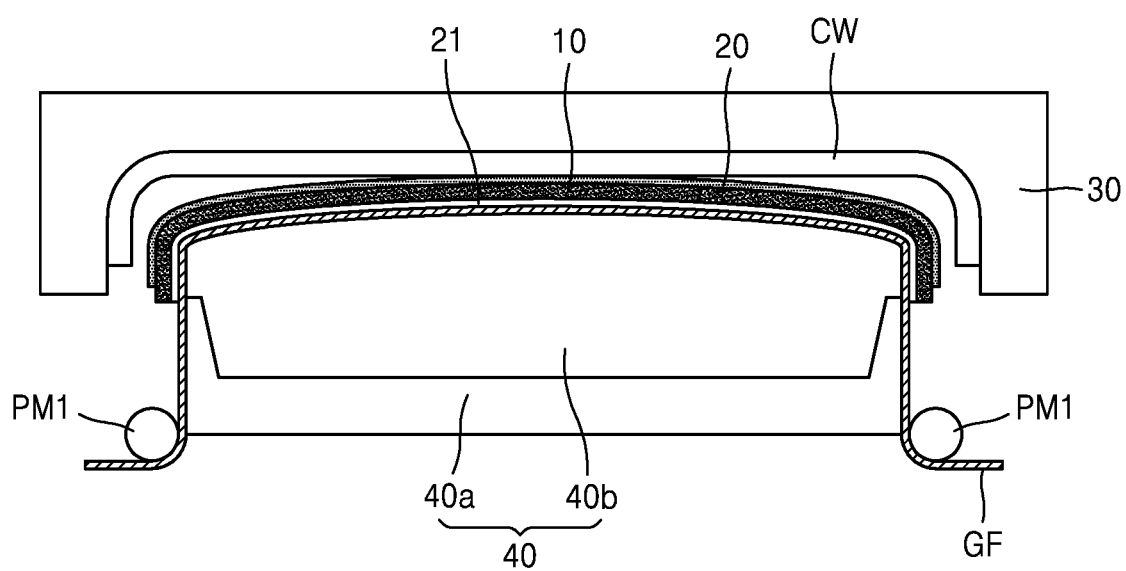

In an embodiment, for example, the push members PM1 and PM2 may be arranged in the auxiliary area AA of the guide film GF, and then, an external force may be applied to the auxiliary area AA of the guide film GF that is mounted on the pad portion 40 through the push members PM1 and PM2. The guide film GF may be bent by the external force applied to the guide film GF as described above. In an embodiment, for example, the guide film GF may be deformed such that the main area MA of the guide film GF has a curvature. When the guide film GF is deformed by the external force, the shape of the display panel 10 attached to the main area MA of the guide film GF may also be deformed. In an embodiment, for example, the first areas A1 and the second areas A2 of the display panel 10 may be deformed to have a curvature, as shown in FIG. 15. The central area CA of the display panel 10 surrounded by the first areas A1 and the second areas A2 (i.e., the inner portion of the display panel 10 defined by the imaginary side lines sd) may also be deformed to have a curvature, as shown in FIGS. 15 and 16. In such an embodiment, because the extension areas EA of the display panel 10 are not attached to the guide film GF, as described above, a part of the extension area EA may not be deformed.

Figure 17:
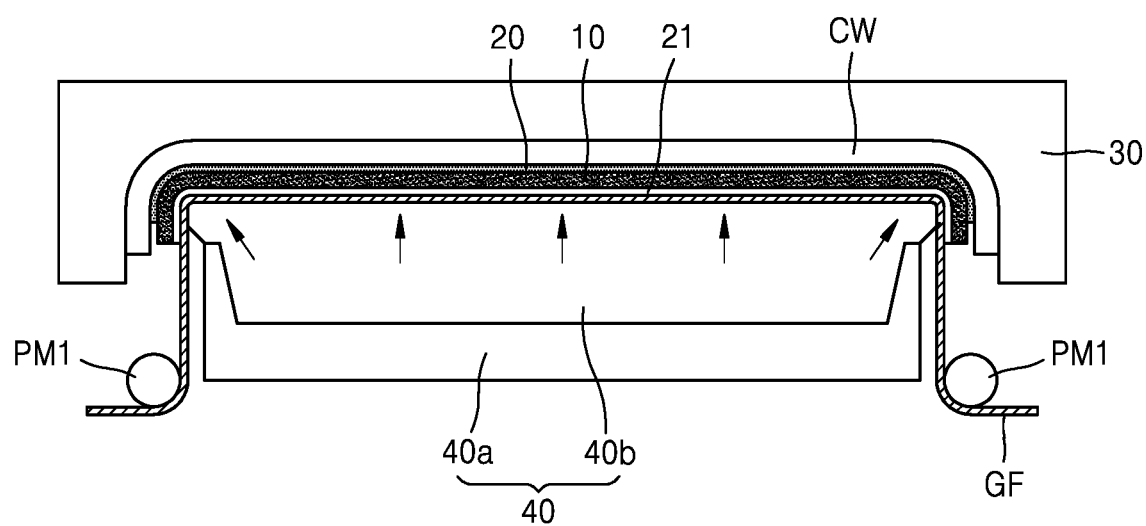

After the display panel 10 is pre-formed, as described above, an operation of bonding the cover window CW to the display panel 10 is performed, as shown in FIGS. 16 and 17.

In an embodiment, as shown in FIG. 16, the front surface of the display panel 10 may be arranged to face the cover window CW, and then, the display panel 10 and the cover window CW may be aligned with each other. Next, the cover window CW and the display panel 10 may be bonded together by using the pad portion 40.

First, as shown in FIG. 16, a portion of the central area CA as a central portion of the display panel 10 may be bonded to the cover window CW. In such an embodiment, in a final shape of the display panel 10, a flat surface having no curvature (e.g., the central area CA) may first be bonded to the cover window CW.

Next, as shown in FIG. 17, the cover window CW may be bonded to the first areas A1, the second areas A2, and the corner areas CNA of the display panel 10 having a curvature. Processes of bonding the cover window CW to the first areas A1, the second areas A2, and the corner areas CNA may be simultaneously performed. In an embodiment, for example, when the first areas A1 and the second areas A2 are bonded to the cover window CW, the corner areas CNA may be naturally bonded to the cover window CW by a peripheral external force.

The pad portion 40 may include a first pad portion 40*a* and a second pad portion 40*b*. The first pad portion 40*a* may be a jig supporting the second pad portion 40*b*. The second pad portion 40*b* may include an air pump or may be connected to an air pump. Because the second pad portion 40*b* has low modulus, a shape and volume of the second pad portion 40*b* may vary according to air pressure through the air pump. The second pad portion 40*b* may include a diaphragm. Pressure may be applied through the second pad portion 40*b* in a state in which the first adhesive layer 20 is in contact with the cover window CW, such that the cover window CW and the display panel 10 are bonded together.

When the first areas A1 and the second areas A2 of the display panel 10 are bonded to the cover window CW, as described above, the corner areas CNA, i.e., the extension areas EA, of the display panel 10 may be naturally bonded to the cover window CW by a peripheral external force. It is desired to prevent defects from occurring at this process. In an embodiment, as described above, the separation areas SA (see FIG. 7) may be between the extension areas EA. When the display panel 10 is bonded to the cover window CW, an area of the separation area SA between the extension areas EA decreases, and the display panel 10 is bonded to the cover window CW. In this process, defects, such as a non-uniform interval between the extension areas EA or even overlapping of the extension areas EA, may occur.

In an embodiment of the display apparatus 1, where the ferromagnetic layers FML (see FIG. 9) are located in the extension areas EA, as described above, such defects may be effectively prevented from occurring. In an embodiment, for example, prior to bonding the display panel 10 to the cover window CW, the ferromagnetic layers FML described above may be magnetized. In such an embodiment, ends of the ferromagnetic layers FML in a direction away from the central area CA may have a same magnetism (or a magnetic pole) as each other. In an embodiment, for example, first ends of the ferromagnetic layers FML in a direction to the central area CA may have an S pole, and second ends of the ferromagnetic layers FML in a direction away from the central area CA may have an N pole. In this case, because the second ends of the ferromagnetic layers FML in the direction away from the central area CA has the same magnetism as each other, a repulsive force is generated between the second ends. Accordingly, in the state described above, by bonding the display panel 10 to the cover window CW, occurrence of defects, such as a non-uniform interval between the extension areas EA or even overlapping of the extension areas EA, may be effectively prevented.

The magnetization of the ferromagnetic layers FML may be performed through at least one selected from various methods. In an embodiment, for example, the ferromagnetic layer FML may be magnetized by allowing a magnet to move in the extension direction of the extension area EA in a state in which the magnet is in contact with the extension area EA. In such an embodiment, a portion of the ferromagnetic layer FML located at a portion of the extension area EA with which the magnet is in initial contact may have a same magnetism as a magnetism of a pole of a portion the magnet, where the portion is in contact with the extension area EA. In addition, a portion of the ferromagnetic layer FML located at a portion of the extension area EA with which the magnet is in final contact may have magnetism that is opposite to the magnetism of the pole of the portion of the magnet, where the portion is in contact with the extension area EA. Alternatively, by locating a specific pole of the magnet to be adjacent to the end of the ferromagnetic layer FML in the direction away from the central area CA, the end of the ferromagnetic layer FML in the direction away from the central area CA may have magnetism that is opposite to magnetism of the specific pole of the magnet, and the end of the ferromagnetic layer FML in the direction to the central area CA may have magnetism corresponding to the specific pole of the magnet.

By allowing the ends, in the direction away from the central area CA, of the ferromagnetic layers FML located in the extension areas EA to have same magnetism as each other through at least one selected from the various methods described above, the display panel 10 and the cover window CW may be bonded together in a state in which a repulsive force is applied between the ends of the extension areas EA in the direction away from the central area CA. Accordingly, defects, such as a non-uniform interval between the extension areas EA or even overlapping of the extension areas EA, may be effectively prevented from occurring in the bonding process.

In an embodiment, after the operation of bonding the display panel 10 to the cover window CW as described above, the display panel 10 to which the cover window CW is attached may be separated from the jig 30 and the pad portion 40. In addition, the guide film GF may also be separated from the display panel 10.

For reference, even when the ferromagnetic layers FML are magnetized, the ferromagnetic layers FML may lose the magnetism thereof, when a sufficient time has elapsed. Accordingly, when a manufacturing of the display apparatus 1 is completed and the display apparatus 1 operates, the ferromagnetic layers FML are not in a magnetized state, and thus, the ferromagnetic layers FML may not adversely affect displaying of high-quality images.

In an embodiment, the separation area SA may also be defined between the first adjacent corner area ACA1 (see FIG. 9) and an extension area of the extension area EA closest to the first adjacent corner area ACA1. Accordingly, in an embodiment, the display apparatus 1 may further include a first adjacent ferromagnetic layer AFML1 (see FIG. 9) in the first adjacent corner area ACA1. In an embodiment, for example, the first adjacent ferromagnetic layer AFML1 may be arranged at an end of the first adjacent corner area ACA1 in the direction to the extension areas EA. The first adjacent ferromagnetic layer AFML1 may also have a shape extending in a direction away from the central area CA. Accordingly, defects may be effectively prevented from occurring between the first adjacent corner area ACA1 and the extension area of the extension areas EA closest to the first adjacent corner area ACA1 in the process of bonding the display panel 10 and the cover window CW together.

An area of the first adjacent ferromagnetic layer AFML1 described above may be in a range of about 80% to about 120% of an area of one of the ferromagnetic layers FML. In an embodiment, for example, where an average of areas of the ferromagnetic layers FML arranged in the extension areas EA is defined as an average area, the area of the first adjacent ferromagnetic layer AFML1 may be in a range of about 80% to about 120% of the average area. If the area of the first adjacent ferromagnetic layer AFML1 is less than about 80% of the average area, a repulsive force between the first adjacent ferromagnetic layer AFML1 and a ferromagnetic layer of the ferromagnetic layers FML closest to the first adjacent ferromagnetic layer AFML1 is not sufficient, and thus, defects may occur when the display panel 10 and the cover window CW are bonded together. If the area of the first adjacent ferromagnetic layer AFML1 exceeds about 120% of the average area, the repulsive force between the first adjacent ferromagnetic layer AFML1 and the ferromagnetic layer of the ferromagnetic layers FML closest to the first adjacent ferromagnetic layer AFML1 becomes excessively large, and thus, defects, such as an interval between the extension areas EA not being properly maintained or the extension areas EA partially overlapping each other, may occur when the display panel 10 and the cover window CW are bonded together.

In an embodiment, the separation area SA may also be defined between the second adjacent corner area ACA2 (see FIG. 9) and an extension area of the extension area EA closest to the second adjacent corner area ACA2. Accordingly, in an embodiment, the display apparatus 1 may further include a second adjacent ferromagnetic layer AFML2 (see FIG. 9) in the second adjacent corner area ACA2. In an embodiment, for example, the second adjacent ferromagnetic layer AFML2 may be arranged at an end of the second adjacent corner area ACA2 in the direction to the extension areas EA. The second adjacent ferromagnetic layer AFML2 may also have a shape extending in the direction away from the central area CA. Accordingly, defects may be effectively prevented from occurring between the second adjacent corner area ACA2 and the extension area of the extension areas EA closest to the second adjacent corner area ACA2 in the process of bonding the display panel 10 and the cover window CW together.

An area of the second adjacent ferromagnetic layer AFML2 may be in a range of about 80% to about 120% of an area of one of the ferromagnetic layers FML. In an embodiment, for example, where an average of areas of the ferromagnetic layers FML arranged in the extension areas EA is defined as an average area, the area of the second adjacent ferromagnetic layer AFML2 may be in a range of about 80% to about 120% of the average area. If the area of the second adjacent ferromagnetic layer AFML2 is less than about 80% of the average area, a repulsive force between the second adjacent ferromagnetic layer AFML2 and a ferromagnetic layer of the ferromagnetic layers FML closest to the second adjacent ferromagnetic layer AFML2 is not sufficient, and thus, defects may occur when the display panel 10 and the cover window CW are bonded together. If the area of the second adjacent ferromagnetic layer AFML2 exceeds about 120% of the average area, the repulsive force between the second adjacent ferromagnetic layer AFML2 and the ferromagnetic layer of the ferromagnetic layers FML closest to the second adjacent ferromagnetic layer AFML2 becomes excessively large, and thus, defects, such as an interval between the extension areas EA not being properly maintained or the extension areas EA partially overlapping each other, may occur when the display panel 10 and the cover window CW are bonded together.

Figure 18:
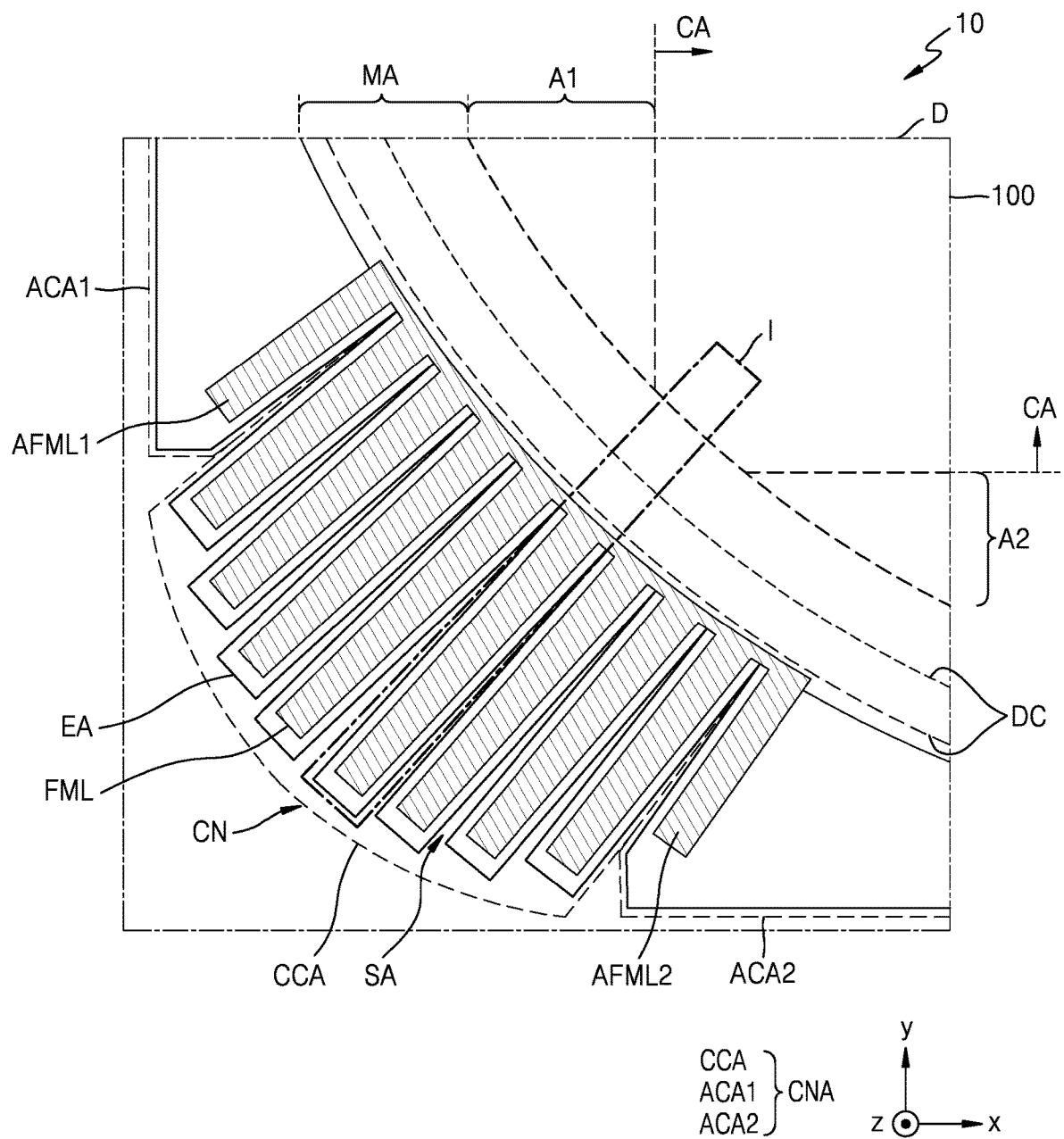
FIG. 18 is a conceptual diagram schematically illustrating a portion of a display apparatus according to an alternative embodiment.

In an embodiment, as shown in FIG. 9, the ferromagnetic layers FML are not in contact with each other. However, the disclosure is not limited thereto. In an alternative embodiment, for example, the ends of the ferromagnetic layers FML in the direction to the central area CA may be connected to each other, as shown in FIG. 18, which is a conceptual diagram schematically illustrating a portion of the display apparatus 1 according to an alternative embodiment. In such an embodiment, the ferromagnetic layers FML may be integrally formed as a single unitary and indivisible body. In such an embodiment, because the ends of the ferromagnetic layers FML in the direction away from the central area CA are apart from each other, when the ferromagnetic layers FML may be magnetized such that the ends have same magnetism as each other, a probability of occurrence of defects in the process of bonding the display panel 10 and the cover window CW together may be substantially reduced.

In an embodiment, as described above, the method of manufacturing the display apparatus 1 may be performed by bonding the display panel 10 and the cover window CW together in a state in which the ferromagnetic layers FML located in the extension areas EA are magnetized.

According to embodiments of the disclosure as described above, a display apparatus in which an occurrence rate of defects in a manufacturing process thereof may be reduced, and a method of manufacturing the display apparatus may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
    a substrate comprising a central area and a corner area, wherein the corner area includes a plurality of extension areas, each of which has a shape extending in a direction away from the central area; and
    a plurality of ferromagnetic layers disposed in the plurality of extension areas and having a shape extending in the direction away from the central area.

2. The display apparatus of claim 1, wherein
    the substrate further comprises a first adjacent corner area, which is located outside the central area and is adjacent to one side of the plurality of extension areas, and
    the display apparatus further comprises a first adjacent ferromagnetic layer in the first adjacent corner area.

3. The display apparatus of claim 2, wherein the first adjacent ferromagnetic layer has a shape extending in the direction away from the central area.

4. The display apparatus of claim 2, wherein an area of the first adjacent ferromagnetic layer is in a range of about 80% to about 120% of an area of one of the plurality of ferromagnetic layers.

5. The display apparatus of claim 2, wherein an area of the first adjacent ferromagnetic layer is in a range of about 80% to about 120% of an average area which is an average of areas of the plurality of ferromagnetic layers.

6. The display apparatus of claim 2, wherein
the substrate further comprises a second adjacent corner area, which is located outside the central area and adjacent to another side of the plurality of extension areas, and
the display apparatus further comprises a second adjacent ferromagnetic layer in the second adjacent corner area.

7. The display apparatus of claim 6, wherein each of the first adjacent ferromagnetic layer and the second adjacent ferromagnetic layer has a shape extending in the direction away from the central area.

8. The display apparatus of claim 6, wherein an area of each of the first adjacent ferromagnetic layer and the second adjacent ferromagnetic layer is in a range of about 80% to about 120% of an area of one of the plurality of ferromagnetic layers.

9. The display apparatus of claim 6, wherein an area of each of the first adjacent ferromagnetic layer and the second adjacent ferromagnetic layer is in a range of about 80% to about 120% of an average area which is an average of areas of the plurality of ferromagnetic layers.

10. The display apparatus of claim 1, further comprising:
a plurality of insulating layers in each of the plurality of extension areas, wherein the plurality of insulating layers is disposed on the substrate,
wherein each of the plurality of ferromagnetic layers is disposed between two adjacent insulating layers among the plurality of insulating layers.

11. The display apparatus of claim 1, further comprising:
a thin-film transistor in each of the plurality of extension areas, wherein the thin-film transistor is disposed on the substrate,
wherein each of the plurality of ferromagnetic layers is disposed on a lower surface of the substrate.

12. The display apparatus of claim 1, wherein the plurality of ferromagnetic layers and the plurality of extension areas correspond to each other in a one-to-one manner.

13. The display apparatus of claim 1, wherein each of the plurality of ferromagnetic layers is disposed in a corresponding one of the plurality of extension areas.

14. The display apparatus of claim 1, wherein ends of the plurality of ferromagnetic layers in a direction to the central area are connected to each other.

15. The display apparatus of claim 14, wherein the plurality of ferromagnetic layers is integrally formed as a single unitary body.

16. The display apparatus of claim 1, wherein the plurality of ferromagnetic layers comprises iron (Fe), nickel (Ni), or cobalt (Co).

17. The display apparatus of claim 1, wherein the substrate further comprises:
a first area adjacent to the central area in a first direction; and
a second area adjacent to the central area in a second direction crossing the first direction,
wherein the corner area at least partially surrounds the first area, the central area, and the second area.

18. The display apparatus of claim 17, wherein the substrate is bent in the corner area, the first area, and the second area.

19. A method of manufacturing a display apparatus, the method comprising:
preparing a display panel which comprises a substrate and a plurality of ferromagnetic layers, wherein the substrate comprises a central area and a corner area comprising a plurality of extension areas, each of which has a shape extending in a direction away from the central area, and wherein the plurality of ferromagnetic layers is disposed in the plurality of extension areas, and each of the plurality of ferromagnetic layers has a shape extending in the direction away from the central area;
magnetizing the plurality of ferromagnetic layers in a way such that an end of each of the plurality of ferromagnetic layers in the direction away from the central area has a same magnetism as each other; and
bonding a cover window to the display panel.

20. The method of claim 19, further comprising:
disposing the display panel on a mold having a surface including a curved portion,
wherein the bonding the cover window to the display panel comprises bonding the cover window to the display panel disposed on the mold.

* * * * *